United States Patent
Katsuta et al.

(10) Patent No.: US 12,426,384 B2
(45) Date of Patent: Sep. 23, 2025

(54) DETECTION DEVICE, DISPLAY DEVICE, AND ILLUMINATION DEVICE WITH DETECTION FUNCTION

(71) Applicant: Magnolia White Corporation, Tokyo (JP)

(72) Inventors: Tadayoshi Katsuta, Tokyo (JP); Yoshitaka Ozeki, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 373 days.

(21) Appl. No.: 18/103,692

(22) Filed: Jan. 31, 2023

(65) Prior Publication Data

US 2023/0178674 A1  Jun. 8, 2023

Related U.S. Application Data

(63) Continuation of application No. PCT/JP2021/021080, filed on Jun. 2, 2021.

(30) Foreign Application Priority Data

Aug. 4, 2020  (JP) ................................ 2020-132399
Apr. 6, 2021  (JP) ................................ 2021-064983

(51) Int. Cl.
*H10F 30/223*  (2025.01)
*H10F 39/00*  (2025.01)
(Continued)

(52) U.S. Cl.
CPC ........... *H10F 30/223* (2025.01); *H10F 39/18* (2025.01); *H10F 39/8057* (2025.01); *G06V 40/1318* (2022.01)

(58) Field of Classification Search
CPC .................................................. H10F 30/223
See application file for complete search history.

(56) References Cited

U.S. PATENT DOCUMENTS 5,448,099 A * 9/1995 Yano ...................... H10F 77/147
257/E27.128
6,111,305 A * 8/2000 Yoshida ................ H10F 77/148
257/458
(Continued)

FOREIGN PATENT DOCUMENTS

JP    2011014752 A  * 1/2011  ............... G01T 1/24
JP    2011-135561 A    7/2011
WO   WO2018/092877 A1   5/2018

OTHER PUBLICATIONS

International Search Report issued in International Patent Application No. PCT/JP2021/021080 on Aug. 24, 2021 and English translation of same. 5 pages.

(Continued)

*Primary Examiner* — Evren Seven
(74) *Attorney, Agent, or Firm* — K&L Gates LLP

(57) ABSTRACT

According to an aspect, a detection device includes a substrate and a plurality of photodiodes arranged on the substrate. Each of the photodiodes comprises a p-type semiconductor layer, an i-type semiconductor layer, and an n-type semiconductor layer stacked on the substrate. Each of the photodiodes includes a plurality of first regions in each of which the p-type semiconductor layer, the i-type semiconductor layer, and the n-type semiconductor layer are stacked so as to be directly in contact with one another, and a second region in which at least the p-type semiconductor layer and the i-type semiconductor layer are stacked so as to be separate from each other. Adjacent first regions included in the plurality of first regions are coupled together by at least the p-type semiconductor layer.

14 Claims, 12 Drawing Sheets

(51) Int. Cl.
*H10F 39/18* (2025.01)
*G06V 40/13* (2022.01)

(56) References Cited

U.S. PATENT DOCUMENTS

| | | | |
|---|---|---|---|
| 2011/0128428 A1* | 6/2011 | Takatoku | G06F 3/0488 |
| | | | 250/208.2 |
| 2012/0038018 A1* | 2/2012 | Yamada | H10F 39/1898 |
| | | | 257/458 |
| 2019/0271878 A1 | 9/2019 | Tsuruda et al. | |
| 2020/0089928 A1 | 3/2020 | Long | |

OTHER PUBLICATIONS

Written Opinion issued in International Patent Application No. PCT/JP2021/021080 on Aug. 24, 2021. 4 pages.
Office Action issued in related Taiwan Patent Application No. 110128356 on Sep. 30, 2022 and English translation of same. 9 pages.

* cited by examiner

DETECTION DEVICE, DISPLAY DEVICE, AND ILLUMINATION DEVICE WITH DETECTION FUNCTION

CROSS-REFERENCES

This application claims the benefit of priority from Japanese Patent Application No. 2020-132399 filed on Aug. 4, 2020, Japanese Patent Application No. 2021-064983 filed on Apr. 6, 2021 and International Patent Application No. PCT/JP2021/021080 filed on Jun. 2, 2021, the entire contents of which are incorporated herein by reference.

BACKGROUND

1. Technical Field

What is disclosed herein relates to a detection device, a display device, and an illumination device with a detection function.

2. Description of the Related Art

United States Patent Application Publication No. 2020/0089928 describes an optical imaging device that includes a light-blocking layer provided with an opening between a microlens and a photosensor. A positive-intrinsic-negative (PIN) photodiode is known as such a photosensor.

A detection device using the PIN photodiode is required to improve detection sensitivity. For example, the PIN photodiode can increase a photocurrent by increasing the sensing area. However, increasing the sensing area increases parasitic capacitance, which may reduce the detection sensitivity.

SUMMARY

According to an aspect, a detection device includes a substrate and a plurality of photodiodes arranged on the substrate. Each of the photodiodes comprises a p-type semiconductor layer, an i-type semiconductor layer, and an n-type semiconductor layer stacked on the substrate. Each of the photodiodes includes a plurality of first regions in each of which the p-type semiconductor layer, the i-type semiconductor layer, and the n-type semiconductor layer are stacked so as to be directly in contact with one another, and a second region in which at least the p-type semiconductor layer and the i-type semiconductor layer are stacked so as to be separate from each other. Adjacent first regions included in the plurality of first regions are coupled together by at least the p-type semiconductor layer.

According to an aspect, a display device includes the detection device and a light-transmitting display. The detection device is provided on a back side of the display.

According to an aspect, an illumination device with a detection function includes the detection device and a light-transmitting illumination device. The detection device is provided on a back side of the illumination device.

According to an aspect, an illumination device with a detection function includes the detection device and a light-transmitting illumination device. The detection device includes a light-transmitting region in an area other than an area provided with the photodiodes and is provided on a back side of the illumination device.

DETAILED DESCRIPTION

Figure 1A:
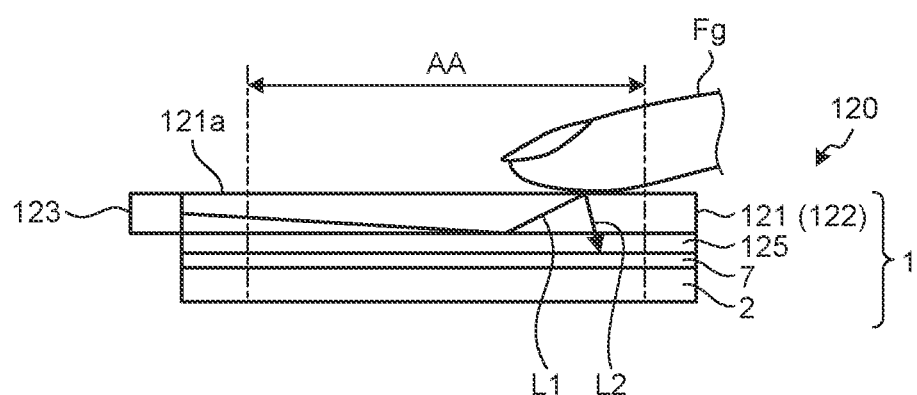
FIG. 1A is a sectional view illustrating a schematic sectional configuration of a detection apparatus having an illumination device, the detection apparatus including a detection device according to an embodiment.

The following describes a mode (embodiment) for carrying out the present disclosure in detail with reference to the drawings. The present disclosure is not limited to the description of the embodiment given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the present disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the present disclosure and the drawings, and detailed description thereof may not be repeated where appropriate.

In the present specification and claims, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

Figure 1B:
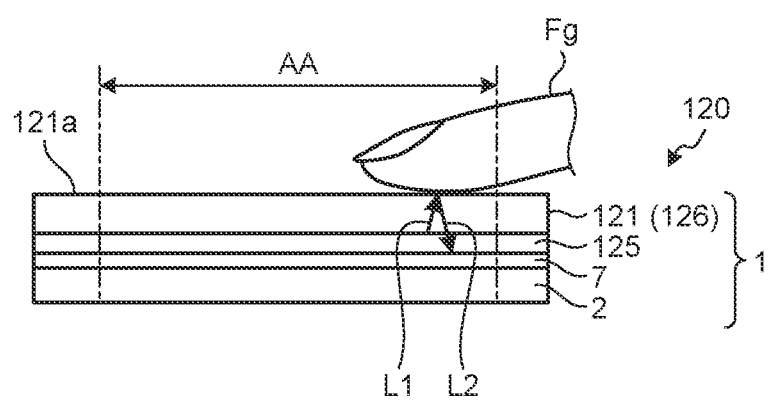
FIG. 1B is a sectional view illustrating a schematic sectional configuration of the detection apparatus having an illumination device, the detection apparatus including the detection device according to a first modification.
Figure 1C:
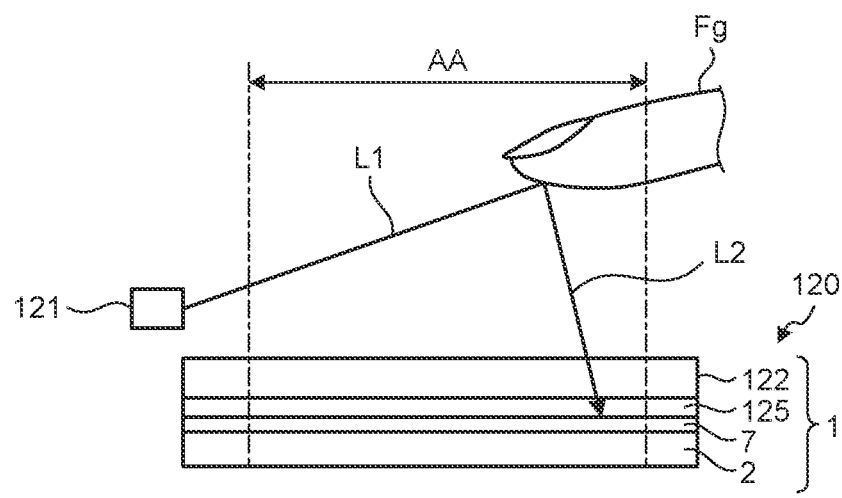
FIG. 1C is a sectional view illustrating a schematic sectional configuration of the detection apparatus having an illumination device, the detection apparatus including the detection device according to a second modification.
Figure 1D:
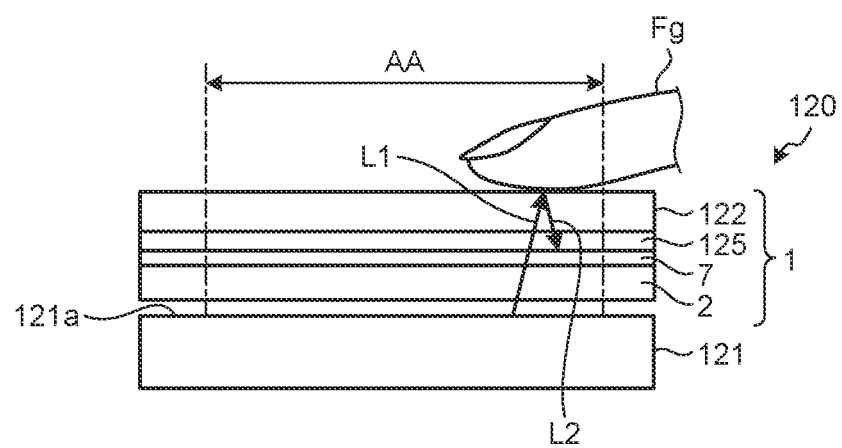
FIG. 1D is a sectional view illustrating a schematic sectional configuration of the detection apparatus having an illumination device, the detection apparatus including the detection device according to a third modification.

FIG. 1A is a sectional view illustrating a schematic sectional configuration of a detection apparatus having an illumination device, the detection apparatus including a detection device according to an embodiment. FIG. 1B is a sectional view illustrating a schematic sectional configuration of the detection apparatus having an illumination device, the detection apparatus including the detection device according to a first modification. FIG. 1C is a sectional view illustrating a schematic sectional configuration of the detection apparatus having an illumination device, the detection apparatus including the detection device according to a second modification. FIG. 1D is a sectional view illustrating a schematic sectional configuration of the detection apparatus having an illumination device, the detection apparatus including the detection device according to a third modification.

As illustrated in FIG. 1A, a detection apparatus 120 having an illumination device includes a detection device 1 and an illumination device 121. The detection device 1 includes an array substrate 2, an optical filter 7, an adhesive layer 125, and a cover member 122. That is, the array substrate 2, the optical filter 7, the adhesive layer 125, and the cover member 122 are stacked in this order in a direction orthogonal to a surface of the array substrate 2. As will be describe later, the cover member 122 of the detection device 1 may be replaced with the illumination device 121. The adhesive layer 125 only needs to bond the optical filter 7 to the cover member 122, and the detection device 1 may have a structure without the adhesive layer 125 in an area corresponding to a detection area AA. When the adhesive layer 125 is absent in the detection area AA, the detection device 1 has a structure in which the adhesive layer 125 bonds the cover member 122 to the optical filter 7 in an area corresponding to a peripheral area GA outside the detection area AA. The adhesive layer 125 provided in the detection area AA may simply be paraphrased as a protective layer for the optical filter 7.

As illustrated in FIG. 1A, the illumination device 121 may be, for example, what is called a side light-type front light that uses the cover member 122 as a light guide plate provided in a position corresponding to the detection area AA of the detection device 1 and includes a plurality of light sources 123 arranged at one end or both ends of the cover member 122. That is, the cover member 122 has a light-emitting surface 121a for emitting light and serves as one component of the illumination device 121. The illumination device 121 emits light L1 from the light-emitting surface 121a of the cover member 122 toward a finger Fg that serves as a detection target. For example, light-emitting diodes (LEDs) for emitting light in a predetermined color are used as the light sources.

As illustrated in FIG. 1B, the illumination device 121 may include the light sources (for example, LEDs) provided directly below the detection area AA of the detection device 1. The illumination device 121 including the light sources also serves as the cover member 122.

The illumination device 121 is not limited to the example of FIG. 1B. As illustrated in FIG. 1C, the illumination device 121 may be provided on a lateral side or an upper side of the cover member 122, and may emit the light L1 to the finger Fg from the lateral side or the upper side of the finger Fg.

Furthermore, as illustrated in FIG. 1D, the illumination device 121 may be what is called a direct-type backlight that includes the light sources (for example, LEDs) provided in the detection area of the detection device 1. Each of the detection apparatuses having an illumination device illustrated in FIG. 1A to FIG. 1D is also referred to as an illumination device with a detection function.

The light L1 emitted from the illumination device 121 is reflected as light L2 by the finger Fg serving as the detection target. The detection device 1 detects the light L2 reflected by the finger Fg (the shade of the light L2 or the intensity of reflected light) to detect asperities (such as a fingerprint) on a surface of the finger Fg. The detection device 1 may further detect information on a living body by detecting the light L2 reflected in the finger Fg, in addition to detecting the fingerprint. Examples of the information on the living body include a blood vessel image, pulsation, and a pulse wave of, for example, a vein. The color of the light L1 from the illumination device 121 may be varied depending on the detection target.

The cover member 122 is a member for protecting the array substrate 2 and the optical filter 7 and covers the array substrate 2 and the optical filter 7. The illumination device 121 may have a structure to serve also as the cover member 122, as described above. In the structures illustrated in FIGS. 1C and 1D in which the cover member 122 is separate from the illumination device 121, the cover member 122 is, for example, a glass substrate. The cover member 122 is not limited to the glass substrate, and may be, for example, a resin substrate, or may be made up of a plurality of layers obtained by stacking these substrates. The cover member 122 may be omitted. In that case, the surface of the array substrate 2 and the optical filter 7 is provided with a protective layer of, for example, an insulating film, and the finger Fg contacts the protective layer of the detection device 1.

The detection apparatus 120 having an illumination device described above may be provided with a display panel 126 instead of the illumination device 121 as illustrated in FIG. 1B. In this case, the detection apparatus 120 having an illumination device illustrated in FIG. 1B is a display device. The display panel 126 may be, for example, an organic electroluminescent (EL) diode (organic light-emitting diode (OLED)) display panel or an inorganic EL (micro-LED or mini-LED) display. Alternatively, the display panel 126 may be a liquid crystal display (LCD) panel using liquid crystal elements as display elements or an electrophoretic display (EPD) panel using electrophoretic elements as the display elements. In this case, display light (light L1) emitted from the display panel 126 is reflected by the finger Fg, and the reflected light passes through the display panel 126 and reaches the optical filter 7. In view of this fact, the display panel 126 is preferably made with a substrate or a multilayered film that transmits light. The fingerprint of the finger Fg and the information on the living body can be detected based on the light L2.

Figure 2:
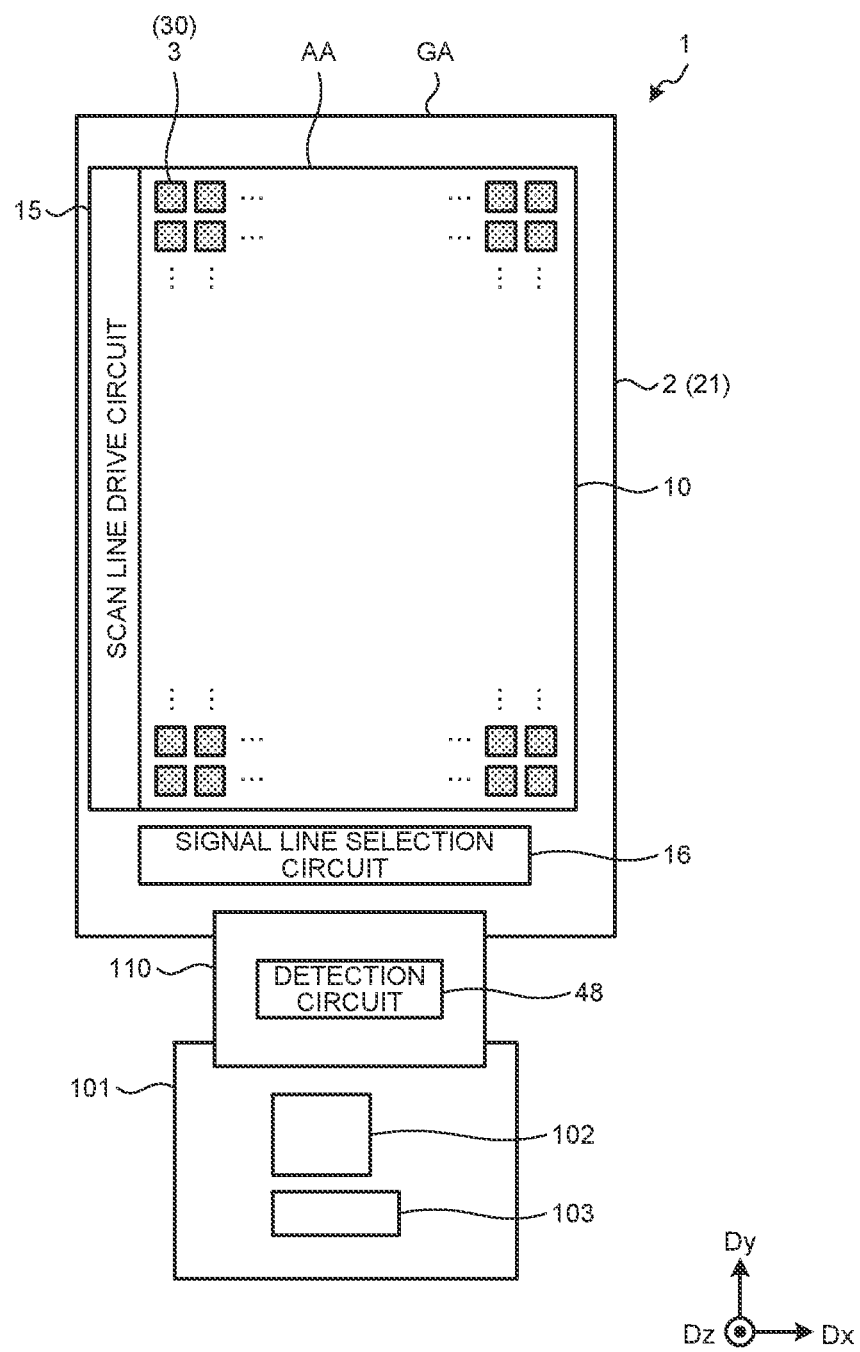
FIG. 2 is a plan view illustrating the detection device according to the embodiment.

FIG. 2 is a plan view illustrating the detection device according to the embodiment. A first direction Dx illustrated in FIG. 2 and the subsequent drawings is one direction in a plane parallel to a substrate 21. A second direction Dy is one direction in the plane parallel to the substrate 21 and is a direction orthogonal to the first direction Dx. The second direction Dy may non-orthogonally intersect the first direction Dx. A third direction Dz is a direction orthogonal to the first direction Dx and the second direction Dy and is a direction normal to the substrate 21.

As illustrated in FIG. 2, the detection device 1 includes the array substrate 2 (substrate 21), a sensor 10, a scan line drive circuit 15, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor 10, the scan line drive circuit 15, and the signal line selection circuit 16 to control an operation of the sensor 10. The power supply circuit 103 supplies voltage signals including, for example, a power supply potential VDD and a reference potential VCOM (refer to FIG. 4) to the sensor 10, the scan line drive circuit 15, and the signal line selection circuit 16. In the present embodiment, the case is exemplified where the detection circuit 48 is disposed on the wiring substrate 110, but the present disclosure is not limited to this case. The detection circuit 48 may be disposed on the substrate 21.

The substrate 21 has the detection area AA and the peripheral area GA. The detection area AA and the peripheral area GA extend in planar directions parallel to the substrate 21. Elements (detection elements 3) of the sensor 10 are provided in the detection area AA. The peripheral area GA is an area outside the detection area AA and is an area not provided with the elements (detection elements 3). That is, the peripheral area GA is an area between the outer periphery of the detection area AA and the outer edges of the substrate 21. The scan line drive circuit 15 and the signal line selection circuit 16 are provided in the peripheral area GA. The scan line drive circuit 15 is provided in an area extending along the second direction Dy in the peripheral area GA. The signal line selection circuit 16 is provided in an area extending along the first direction Dx in the peripheral area GA and is provided between the sensor 10 and the detection circuit 48.

Each of the detection elements 3 of the sensor 10 is a photosensor including a photodiode 30 as a sensor element. The photodiode 30 is a photoelectric conversion element, and outputs an electrical signal corresponding to light irradiating each of the photodiodes 30. More specifically, the photodiode 30 is a positive-intrinsic-negative (PIN) photodiode. The photodiode 30 may be paraphrased as an organic photodiode (OPD). The detection elements 3 are arranged in a matrix having a row-column configuration in the detection area AA. The photodiodes 30 included in the detection elements 3 perform the detection in accordance with gate drive signals (for example, a reset control signal RST and a read control signal RD) supplied from the scan line drive circuit 15. Each of the photodiodes 30 outputs the electrical signal corresponding to the light received by the photodiode 30 as a detection signal Vdet to the signal line selection circuit 16. The detection device 1 detects the information on the living body based on the detection signals Vdet received from the photodiodes 30.

Figure 3:
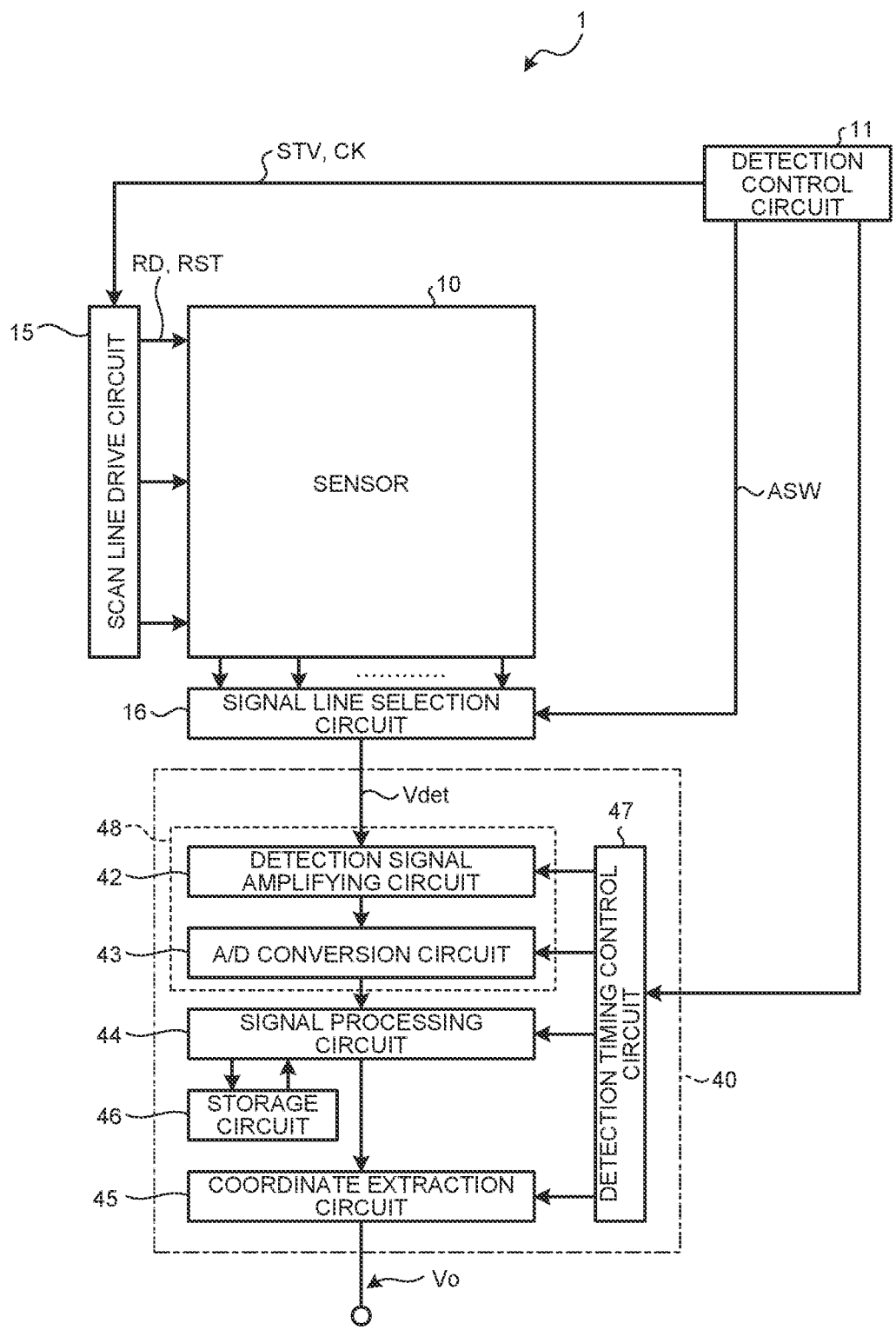
FIG. 3 is a block diagram illustrating a configuration example of the detection device according to the embodiment.

FIG. 3 is a block diagram illustrating a configuration example of the detection device according to the embodiment. As illustrated in FIG. 3, the detection device 1 further includes a detection control circuit 11 and a detector 40. The control circuit 102 includes one, some, or all functions of the detection control circuit 11. The control circuit 102 also includes one, some, or all functions of the detector 40 other than those of the detection circuit 48.

The detection control circuit 11 is a circuit that supplies respective control signals to the scan line drive circuit 15, the signal line selection circuit 16, and the detector 40 to control operations of these components. The detection control circuit 11 supplies various control signals including, for example, a start signal STV and a clock signal CK to the scan line drive circuit 15. The detection control circuit 11 also supplies various control signals including, for example, a selection signal ASW to the signal line selection circuit 16.

The scan line drive circuit 15 is a circuit that drives a plurality of scan lines (read control scan line GLrd and reset control scan line GLrst (refer to FIG. 4)) based on the various control signals. The scan line drive circuit 15 sequentially or simultaneously selects the scan lines, and supplies the gate drive signals (for example, the reset control signals RST and the read control signals RD) to the selected scan lines. By this operation, the scan line drive circuit 15 selects the photodiodes 30 coupled to the scan lines.

Figure 4:
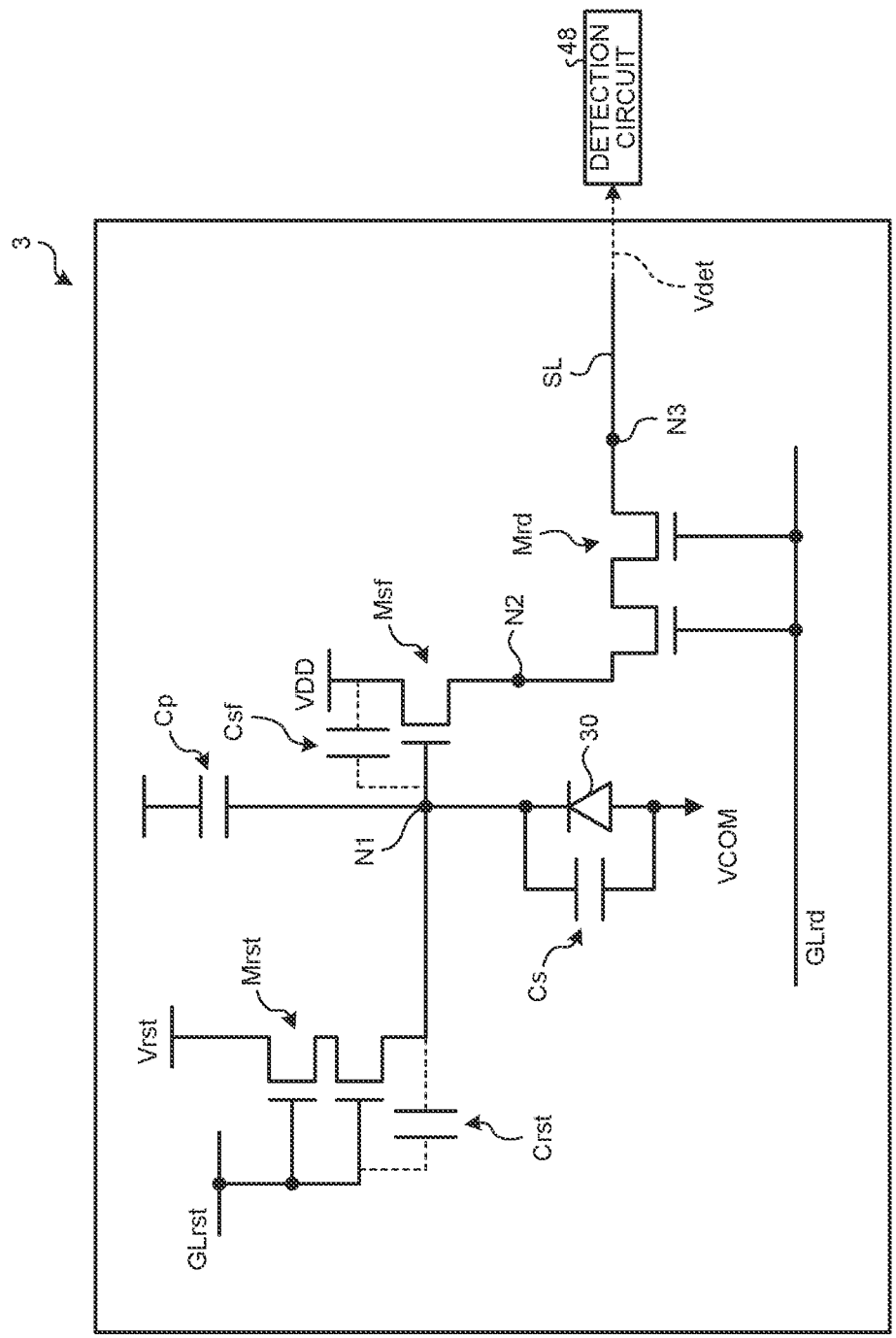
FIG. 4 is a circuit diagram illustrating a detection element.

The signal line selection circuit 16 is a switch circuit that sequentially or simultaneously selects a plurality of output signal lines SL (refer to FIG. 4). The signal line selection circuit 16 is, for example, a multiplexer. The signal line selection circuit 16 couples the selected output signal lines SL to the detection circuit 48 based on the selection signal ASW supplied from the detection control circuit 11. By this operation, the signal line selection circuit 16 outputs the detection signals Vdet of the photodiodes 30 to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 amplifies the detection signal Vdet and is an integration circuit, for example. The A/D conversion circuit 43 converts an analog signal output from the detection signal amplifying circuit 42 into a digital signal.

The signal processing circuit 44 is a logic circuit that detects a predetermined physical quantity received by the sensor 10 based on output signals of the detection circuit 48. The signal processing circuit 44 can detect the asperities on the surface of the finger Fg or a palm (the fingerprint or a palm print) based on the signals from the detection circuit 48 when the finger Fg is in contact with or in proximity to a detection surface. The signal processing circuit 44 may detect the information on the living body based on the signals from the detection circuit 48. Examples of the information on the living body include the blood vessel image, the pulse wave, the pulsation, and a blood oxygen saturation level of the finger Fg or the palm.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the finger Fg or the like when the contact or proximity of the finger Fg is detected by the signal processing circuit 44. The coordinate extraction circuit 45 is the logic circuit that also obtains detected coordinates of blood vessels of the finger Fg or the palm. The coordinate extraction circuit 45 combines the detection signals Vdet output from the respective detection elements 3 of the sensor 10 to generate two-dimensional information representing a shape of the asperities on the surface of the finger Fg or the like. The coordinate extraction circuit 45 may output the detection signals Vdet as sensor outputs Vo instead of calculating the detected coordinates.

The following describes a circuit configuration example of the detection device 1. FIG. 4 is a circuit diagram illustrating the detection element. As illustrated in FIG. 4, the detection element 3 includes the photodiode 30, a reset transistor Mrst, a read transistor Mrd, and a source follower transistor Msf. The reset transistor Mrst, the read transistor Mrd, and the source follower transistor Msf are provided correspondingly to one photodiode 30. The reset transistor Mrst, the read transistor Mrd, and the source follower transistor Msf are each fabricated from an n-type thin-film transistor (TFT). However, each of the transistors is not limited thereto, and may be fabricated from a p-type TFT.

The reference potential VCOM is applied to the anode of the photodiode 30. The cathode of the photodiode 30 is coupled to a node N1. The node N1 is coupled to a capacitor (capacitance) Cs, one of the source and the drain of the reset transistor Mrst, and the gate of the source follower transistor Msf. The node N1 further has parasitic capacitance Cp and input capacitance Crst and Csf. When light is incident on the photodiode 30, a signal (electric charge) output from the photodiode 30 is stored in the capacitance Cs.

The capacitance Cs is capacitance formed between a p-type semiconductor layer 33 and an n-type semiconductor layer 32 of the photodiode 30 (refer to FIG. 7), for example. The parasitic capacitance Cp is capacitance added to the capacitance Cs and is capacitance generated between various types of wiring and electrodes provided on the array substrate 2. The input capacitance Crst and the input capacitance Csf are the capacitance of the reset transistor Mrst and the capacitance of the source follower transistor Msf, respectively, as viewed from the input side thereof. More specifically, each of the input capacitance values Crst and Csf is obtained by adding capacitance between the gate and the source to capacitance between the gate and the drain.

The gate of the reset transistor Mrst is coupled to the reset control scan line GLrst. The other of the source and the drain of the reset transistor Mrst is supplied with a reset potential Vrst. When the reset transistor Mrst is turned on (into a conduction state) in response to the reset control signal RST, the potential of the node N1 is reset to the reset potential Vrst. The reference potential VCOM is lower than the reset potential Vrst, and the photodiode 30 is driven in a reverse bias state.

The source follower transistor Msf is coupled between a terminal supplied with the power supply potential VDD and the read transistor Mrd (node N2). The gate of the source follower transistor Msf is coupled to the node N1. The gate of the source follower transistor Msf is supplied with a signal (electric charge) generated by the photodiode 30. This operation causes the source follower transistor Msf to output a voltage signal corresponding to the signal (electric charge) generated by the photodiode 30 to the read transistor Mrd.

The read transistor Mrd is coupled between the source of the source follower transistor Msf (node N2) and a corresponding one of the output signal lines SL (node N3). The gate of the read transistor Mrd is coupled to the read control scan line GLrd. When the read transistor Mrd is turned on in response to the read control signal RD, the signal output from the source follower transistor Msf, that is, the voltage signal corresponding to the signal (electric charge) generated by the photodiode 30 is output as the detection signal Vdet to the output signal line SL.

In the example illustrated in FIG. 4, the reset transistor Mrst and the read transistor Mrd each have what is called a double-gate structure configured by coupling two transistors in series. However, the reset transistor Mrst and the read transistor Mrd are not limited to this structure and may have a single-gate structure or a multi-gate structure including three or more transistors coupled in series. The circuit of one detection element 3 is not limited to the configuration including the three transistors of the reset transistor Mrst, the source follower transistor Msf, and the read transistor Mrd. The detection element 3 may include two transistors, or four or more transistors.

Figure 5:
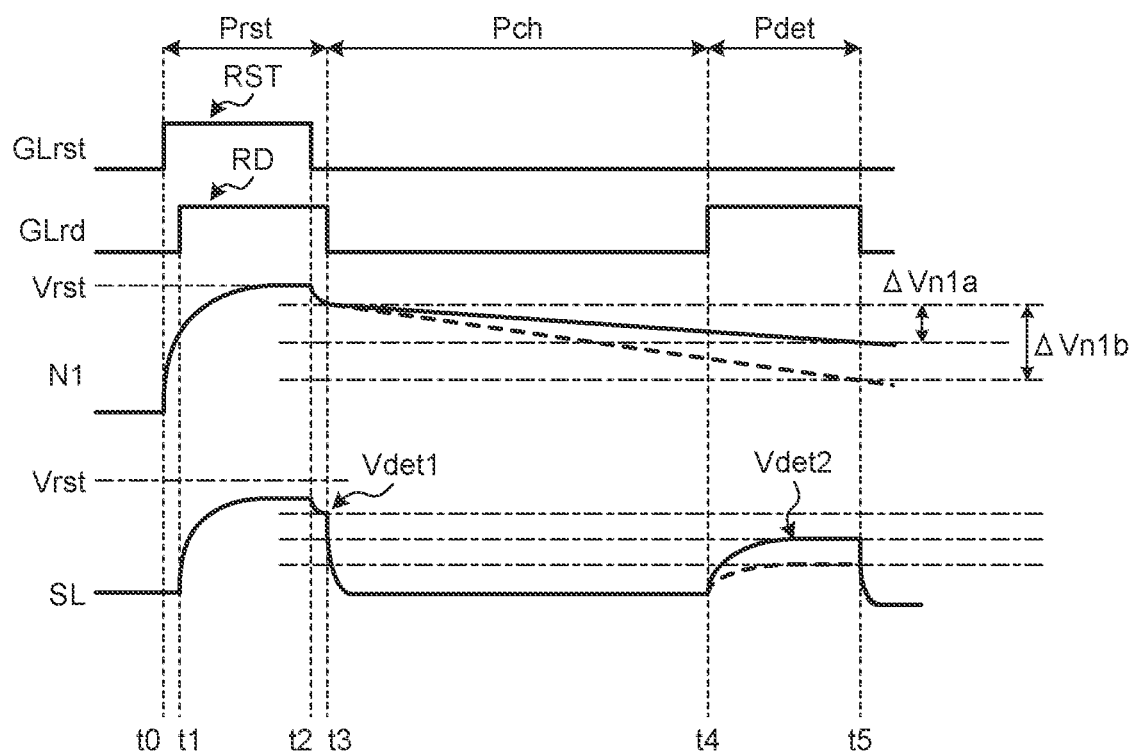
FIG. 5 is a timing waveform diagram illustrating an operation example of the detection element.

FIG. 5 is a timing waveform diagram illustrating an operation example of the detection element. As illustrated in FIG. 5, the detection element 3 performs the detection in the order of a reset period Prst, an exposure period Pch, and a read period Pdet. The power supply circuit 103 supplies the reference potential VCOM to the anode of the photodiode 30 over the reset period Prst, the exposure period Pch, and the read period Pdet.

At time t0, the control circuit 102 sets the reset control signal RST to be supplied to the reset control scan line GLrst to HIGH (high-level voltage) to start the reset period Prst. In the reset period Prst, the reset transistor Mrst is tuned on (into the conduction state), and thus, the potential of the node N1 increases to the reset potential Vrst.

At time t1, the control circuit 102 sets the read control signal RD to be supplied to the read control scan line GLrd to HIGH (high-level voltage). As a result, the read transistor Mrd is turned on (into the conduction state).

At time t2, the control circuit 102 sets the reset control signal RST to LOW (low-level voltage), and thus, the reset period Prst ends. At time t2, the reset transistor Mrst is tuned off (into a nonconduction state).

The signal corresponding to the light irradiating the photodiode 30 is stored to reduce the potential of the node N1 to (Vrst−ΔVn1). The term ΔVn1 denotes a signal (voltage change amount) corresponding to the light irradiating the photodiode 30.

At time t3, the potential of the detection signal Vdet output from the output signal line SL reaches (Vrst−Vthsf−Vrdon). The term Vthsf denotes a threshold voltage Vthsf of the source follower transistor Msf. The term Vrdon denotes a voltage drop caused by on-resistance of the read transistor Mrd.

At time t3, the control circuit 102 sets the read control signal RD to LOW (low-level voltage). As a result, the read transistor Mrd is turned off (into the nonconduction state). Thus, the potential of the node N2 is set to be constant, and the potential of the detection signal Vdet output from the output signal line SL is also set to LOW (low-level voltage).

At time t4, the control circuit 102 sets the read control signal RD to HIGH (high-level voltage) again. As a result, the read transistor Mrd is turned on (into the conduction state). Thus, the exposure period Pch ends, and the read period Pdet starts. The potential of a detection signal Vdet2 output during the read period Pdet drops by the amount of the signal ΔVn1 from the potential of the detection signal Vdet1 obtained at time t3 to (Vrst−Vthsf−Vrdon−ΔVn1).

The detector 40 can detect the light irradiating the photodiode 30 based on the signal (ΔVn1) of the difference between the detection signal Vdet1 at time t3 and the detection signal Vdet2 at time t5. For example, a signal ΔVn1a illustrated in FIG. 5 is a signal (voltage change amount) generated when illuminance is low, and a signal ΔVn1b is a signal (voltage change amount) generated when the illuminance is high. The detection device 1 can detect the intensity of the light L2 for each of the detection elements 3 based on the difference between the signal ΔVn1a and the signal ΔVn1b. For example, the asperities of a fingerprint and the blood vessel image (vein pattern) of a finger pressing the detection surface can be detected by integrating the detection results of the individual detection elements 3.

While FIG. 5 illustrates the operation example of one of the detection elements 3, the scan line drive circuit 15 can cause the detection elements 3 in the entire detection area AA to perform the detection by sequentially scanning the reset control scan lines GLrst and the read control scan lines GLrd in a time-division manner.

When capacitance Cn1 denotes the total capacitance added to the photodiode 30, the capacitance Cn1 is represented by Expression (1) below. In Expression (1), the capacitance Cs, the parasitic capacitance Cp, and the input capacitance Crst and Csf are various types capacitance equivalently coupled to the cathode of the photodiode 30 (node N1) described above with reference to FIG. 4.

$$Cn1 = Cs + Crst + Csf + Cp \qquad (1)$$

The signal $\Delta Vn1$ is represented by Expression (2) below. In Expression (2), $\Delta Q$ denotes an electric charge stored during the exposure period Pch; Ip denotes a photocurrent that flows depending on the light incident on the photodiode 30; and T denotes an exposure time (period from time t3 to time t4).

$$\Delta Vn1 = \Delta Q/Cn1 = (Ip \times T)/Cn1 \qquad (2)$$

As represented by Expression (2), the signal $\Delta Vn1$ can be increased by reducing the capacitance Cn1. That is, the detection sensitivity of the detection device 1 is can be increased by reducing the capacitance Cn1 even when the same object to be detected is detected under the same detection conditions.

Figure 6:
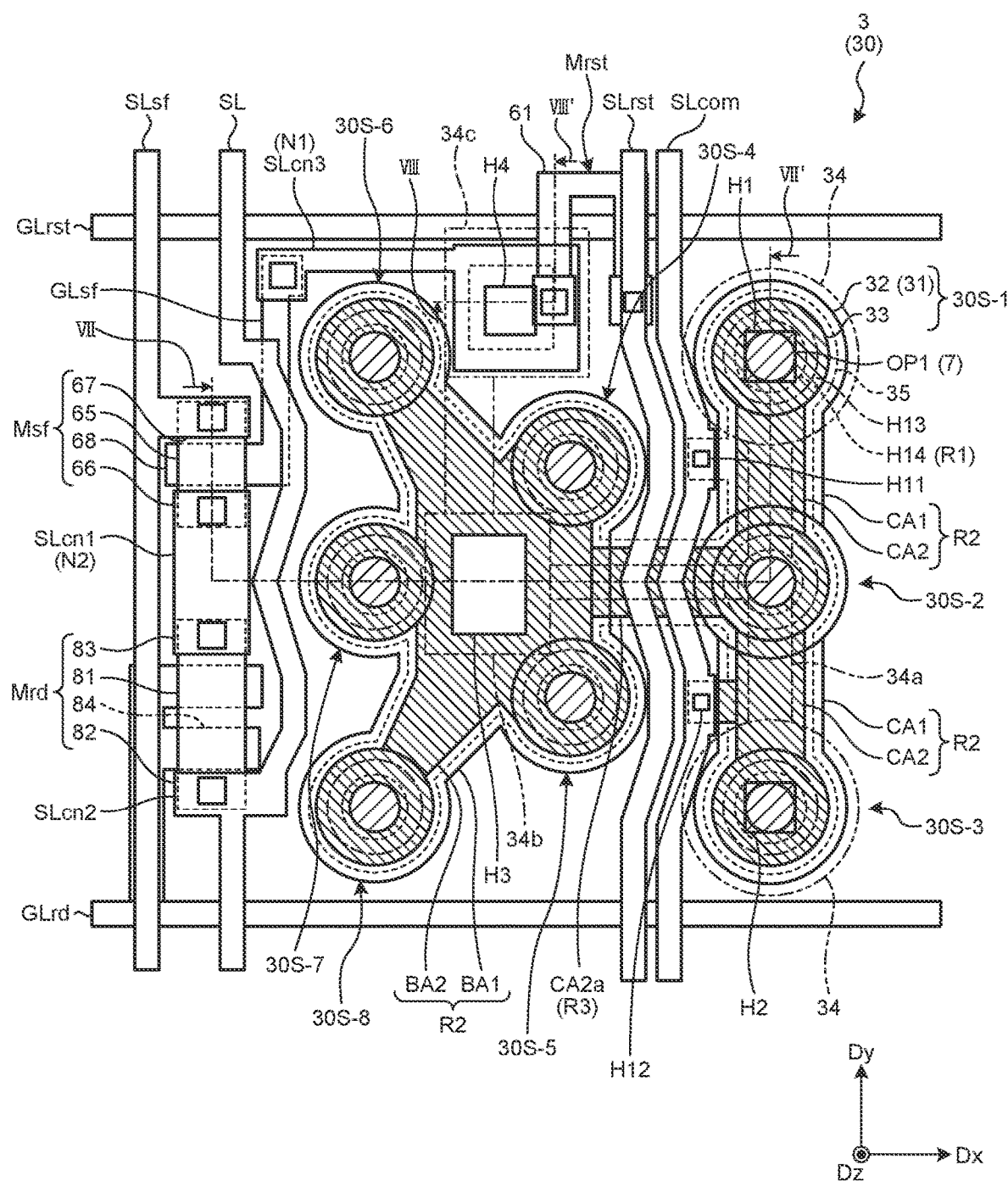
FIG. 6 is a plan view illustrating the detection element.

The following describes a planar configuration and a sectional configuration of the detection element 3. FIG. 6 is a plan view illustrating the detection element. As illustrated in FIG. 6, each of the detection elements 3 includes two scan lines (the read control scan line GLrd and the reset control scan line GLrst) and four signal lines (the output signal line SL, a power supply signal line SLsf, a reset signal line SLrst, and a reference signal line SLcom).

The read control scan line GLrd and the reset control scan line GLrst extend in the first direction Dx, and are arranged in the second direction Dy. The output signal line SL, the power supply signal line SLsf, the reset signal line SLrst, and the reference signal line SLcom extend in the second direction Dy and are arranged in the first direction Dx.

The detection element 3 is defined as an area surrounded by the two scan lines (the read control scan line GLrd and the reset control scan line GLrst) and two signal lines (for example, two power supply signal lines SLsf of the adjacent detection elements 3).

As illustrated in FIG. 6, the photodiode 30 includes a plurality of partial photodiodes 30S-1, 30S-2, . . . , 30S-8. The partial photodiodes 30S-1, 30S-2, . . . , 30S-8 are arranged in a triangular lattice pattern.

Figure 9:
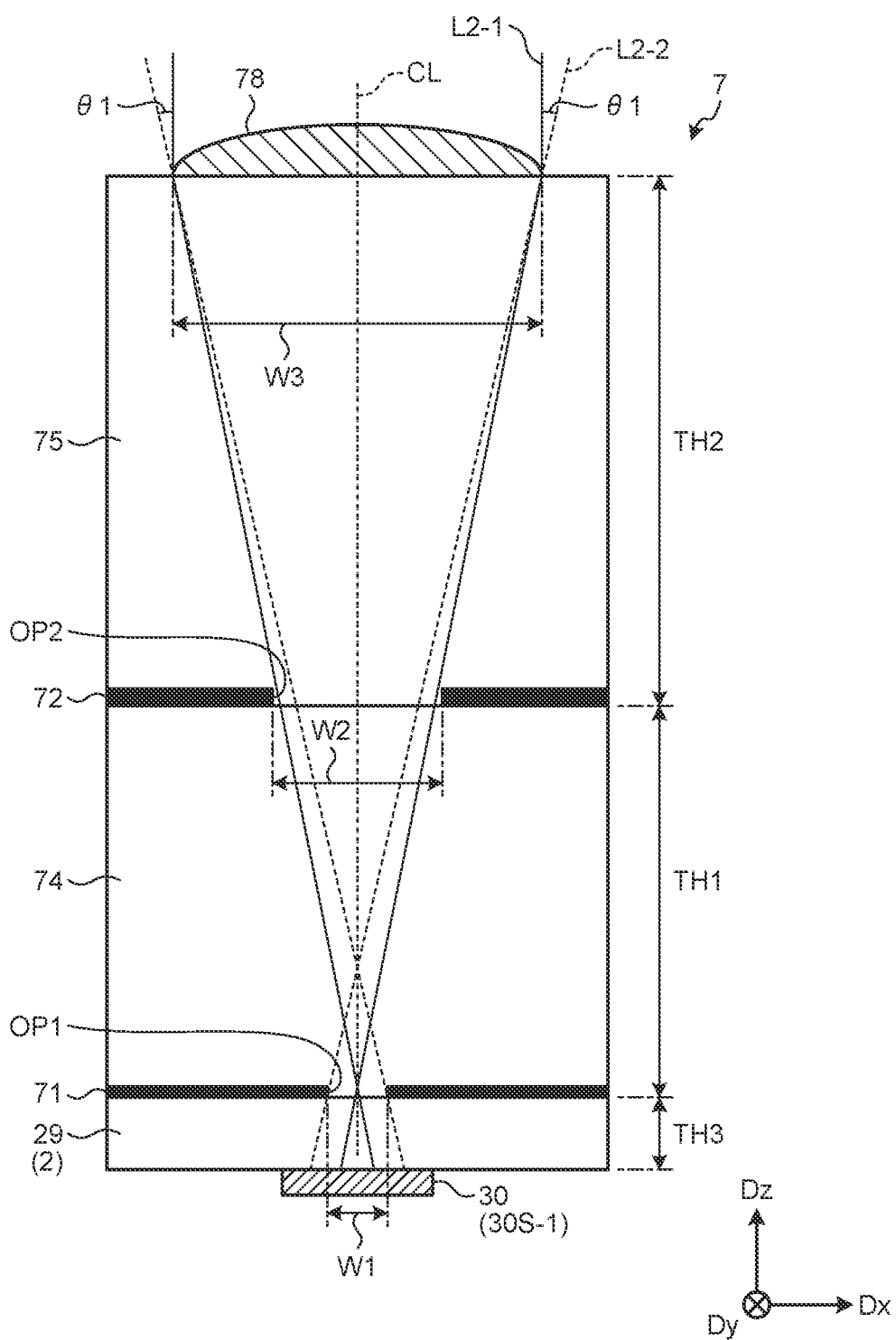
FIG. 9 is a sectional view illustrating a configuration example of an optical filter.

A lens 78 of the optical filter 7, a first opening OP1 of a first light-blocking layer 71, and a second opening OP2 of a second light-blocking layer 72, which are illustrated in FIG. 9, are provided for each of the partial photodiodes 30S-1, 30S-2, . . . , 30S-8 so as to overlap a corresponding one of the partial photodiode. For ease of viewing, FIG. 6 illustrates only the first opening OP1 among the components of the optical filter 7.

More specifically, the partial photodiodes 30S-1, 30S-2, and 30S-3 are arranged in the second direction Dy. The partial photodiodes 30S-4 and 30S-5 are arranged in the second direction Dy and are adjacent to an element column made up of the partial photodiodes 30S-1, 30S-2, and 30S-3 in the first direction Dx. The partial photodiodes 30S-6, 30S-7, and 30S-8 are arranged in the second direction Dy and are adjacent to an element column made up of the partial photodiodes 30S-4 and 30S-5 in the first direction Dx. The positions in the second direction Dy of the partial photodiodes 30S are arranged in a staggered manner between the adjacent element columns.

The light L2 is incident on each of the partial photodiodes 30S-1, 30S-2, . . . , 30S-8 through the optical filter 7. The partial photodiodes 30S-1, 30S-2, . . . , 30S-8 are electrically coupled together to serves as one photodiode 30. That is, signals output from the respective partial photodiodes 30S-1, 30S-2, . . . , 30S-8 are integrated into one detection signal Vdet, which is then output from the photodiode 30. In the following description, the partial photodiodes 30S-1, 30S-2, . . . , 30S-8 will be simply referred to as "partial photodiodes 30S" when need not be distinguished from one another.

Each of the partial photodiodes 30S includes an i-type semiconductor layer 31, the n-type semiconductor layer 32, and the p-type semiconductor layer 33. The i-type semiconductor layer 31 and the n-type semiconductor layer 32 are formed of, for example, amorphous silicon (a-Si). The p-type semiconductor layer 33 is formed of, for example, polysilicon (p-Si). The material of each of the semiconductor layers is not limited to these materials and may be, for example, polysilicon or microcrystalline silicon.

The a-Si of the n-type semiconductor layer 32 is doped with impurities to form an n+ region. The p-Si of the p-type semiconductor layer 33 is doped with impurities to form a p+ region. The i-type semiconductor layer 31 is, for example, a non-doped intrinsic semiconductor, and has lower conductivity than that of the n-type semiconductor layer 32 and the p-type semiconductor layer 33.

In FIG. 6, a dotted line indicates a first region R1 serving as an effective sensor region in which the p-type semiconductor layer 33 and the i-type semiconductor layer 31 (and the n-type semiconductor layer 32) overlap each other and are directly coupled together. Each of the partial photodiodes 30S includes at least the first region R1. In other words, the multiple first regions R1 are arranged in a triangular lattice pattern in a plan view. The first opening OP1 of the optical filter 7 is provided so as to overlap the first region R1.

Each of the partial photodiodes 30S is formed in a circular shape or a semi-circular shape in the plan view. The shape of the partial photodiode 30S is, however, not limited thereto, and may be, for example, a polygonal shape. The partial photodiodes 30S may have shapes different from one another.

The n-type semiconductor layers 32 of the partial photodiodes 30S-1, 30S-2, and 30S-3 arranged in the second direction Dy are electrically coupled together by a coupling portion CA1. The p-type semiconductor layers 33 of the partial photodiodes 30S-1, 30S-2, and 30S-3 are electrically coupled together by a coupling portion CA2.

The n-type semiconductor layers 32 (i-type semiconductor layers 31) of the partial photodiodes 30S-4, 30S-5, 30S-6, 30S-7, and 30S-8 are electrically coupled together by a base portion BA1. The p-type semiconductor layers 33 of the partial photodiodes 30S-4, 30S-5, 30S-6, 30S-7, and 30S-8 are electrically coupled together by a base portion BA2. The base portions BA1 and BA2 are each formed in a substantially pentagonal shape and are provided, in the apical positions thereof, with the partial photodiodes 30S-4, 30S-5, 30S-6, 30S-7, and 30S-8.

The base portion BA1 is disposed so as to be separate from the i-type semiconductor layers 31 and the n-type semiconductor layers 32 of the partial photodiodes 30S-1, 30S-2, and 30S-3 in the first direction Dx. In contrast, the base portion BA2 coupled to the p-type semiconductor layers 33 of the partial photodiodes 30S-4, 30S-5, 30S-6, 30S-7, and 30S-8 is electrically coupled to the p-type semiconductor layers 33 of the partial photodiodes 30S-1, 30S-2, and 30S-3 by a coupling portion CA2a passing below the reset signal line SLrst and the reference signal line SLcom along the first direction Dx. This configuration electrically couples together the partial photodiodes 30S constituting one photodiode 30.

A lower conductive layer 35 is provided in an area overlapping the partial photodiodes 30S, the coupling portions CA1, CA2, and CA2a, and the base portions BA1 and BA2. Portions of the lower conductive layer 35 overlapping the partial photodiodes 30S are each formed in a circular shape. However, the portions of the lower conductive layer 35 may each have a different shape from that of the partial photodiode 30S. The lower conductive layer 35 only needs to be provided in portions overlapping at least the first regions R1. The lower conductive layer 35 is supplied with the reference potential VCOM that is the same as the potential of the p-type semiconductor layers 33, and thus, can reduce the parasitic capacitance between the lower conductive layer 35 and the p-type semiconductor layers 33.

An upper conductive layer 34 electrically couples together the n-type semiconductor layers 32 of the partial photodiodes 30S. Specifically, the upper conductive layer 34 is electrically coupled to the n-type semiconductor layers 32 of the partial photodiodes 30S-1 and 30S-3 in positions overlapping therewith, through contact holes H1 and H2 provided in an insulating film 27 (refer to FIG. 7). A coupling portion 34a of the upper conductive layer 34 is formed in a T-shape so as to overlap the coupling portions CA1, CA2, CA2a, and the partial photodiode 30S-2 and is coupled to a coupling portion 34b. The coupling portion 34b of the upper conductive layer 34 is electrically coupled to the n-type semiconductor layer 32 of the base portion BA1 in a position overlapping the base portion BA1, through a contact hole H3 provided in the insulating film 27 (refer to FIG. 7).

Furthermore, the upper conductive layer 34 extends from the coupling portion 34b to an area not overlapping the photodiode 30 and is coupled to a coupling portion 34c. The coupling portion 34c of the upper conductive layer 34 is electrically coupled to the transistors (the reset transistor Mrst and the source follower transistor Msf (refer to FIG. 4)) through a contact hole H4. The upper conductive layer 34 may be provided in any manner, for example, may be provided so as to partially cover the partial photodiodes 30S, or entirely cover the partial photodiodes 30S.

The reset transistor Mrst, the source follower transistor Msf, and the read transistor Mrd are provided in an area not overlapping the photodiode 30. The source follower transistor Msf and the read transistor Mrd are provided, for example, adjacent in the first direction Dx to the photodiode 30. The reset transistor Mrst is disposed adjacent in the second direction Dy to the partial photodiode 30S-4 and is disposed between the partial photodiode 30S-1 and the partial photodiode 30S-6 in the first direction Dx.

One end of a semiconductor layer 61 of the reset transistor Mrst is coupled to the reset signal line SLrst. The other end of the semiconductor layer 61 is coupled to coupling wiring line SLcn3 (node N1) through a contact hole H17 (refer to FIG. 8). A portion of the reset signal line SLrst coupled to the semiconductor layer 61 serves as a source electrode, and a portion of the coupling wiring line SLcn3 coupled to the semiconductor layer 61 serves as a drain electrode 63 (refer to FIG. 8). The semiconductor layer 61 is formed in a U-shape, and intersects the reset control scan line GLrst at two locations. Channel regions are formed in portions of the semiconductor layer 61 overlapping the reset control scan line GLrst, and portions of the reset control scan line GLrst overlapping the semiconductor layer 61 each serve as a gate electrode 64.

The source follower transistor Msf includes a semiconductor layer 65, a source electrode 66, a drain electrode 67, and a gate electrode 68. One end of the semiconductor layer 65 is coupled to the power supply signal line SLsf through a contact hole H15 (refer to FIG. 7). The other end of the semiconductor layer 65 is coupled to coupling wiring line SLcn1 (node N2) through a contact hole H16 (refer to FIG. 7). A portion of the power supply signal line SLsf coupled to the semiconductor layer 65 serves as the drain electrode 67, and a portion of the coupling wiring line SLcn1 coupled to the semiconductor layer 65 serves as the source electrode 66.

One end side of the gate electrode 68 extends in the first direction Dx, and overlaps the semiconductor layer 65. The other end side of the gate electrode 68 extends in the second direction Dy and is electrically coupled to the coupling wiring line SLcn3. This configuration electrically couples the reset transistor Mrst to the gate of the source follower transistor Msf through the coupling wiring line SLcn3.

The read transistor Mrd includes a semiconductor layer 81, a source electrode 82, a drain electrode 83, and gate electrodes 84. One end of the semiconductor layer 81 is coupled to the coupling wiring line SLcn1. The other end of the semiconductor layer 81 is coupled to coupling wiring line SLcn2 branching in the first direction Dx from the output signal line SL. A portion of the coupling wiring line SLcn1 coupled to the semiconductor layer 81 serves as the drain electrode 83, and a portion of the coupling wiring line SLcn2 coupled to the semiconductor layer 81 serves as the source electrode 82. The two gate electrodes 84 are arranged in the second direction Dy and overlap the semiconductor layer 81. The two gate electrodes 84 are electrically coupled to the read control scan line GLrd through a branch that extends in the second direction Dy and overlaps the power supply signal line SLsf. The above-described configuration couples the source follower transistor Msf and the read transistor Mrd to the output signal line SL.

The output signal line SL is disposed between where the source follower transistor Msf and the read transistor Mrd are located and where the partial photodiodes 30S-6, 30S-7, and 30S-8 are located. The output signal line SL is provided in a zig-zag manner along the partial photodiodes 30S-6, 30S-7, and 30S-8.

The reset signal line SLrst and the reference signal line SLcom are arranged between the partial photodiodes 30S-1, 30S-2, 30S-3 and the partial photodiodes 30S-4, 30S-5. The reset signal line SLrst and the reference signal line SLcom are provided in a zig-zag manner along the partial photodiodes 30S and intersect the coupling portion CA2a. Since the partial photodiodes 30S-1, 30S-2, and 30S-3 are coupled to the partial photodiodes 30S-4 and 30S-5 through the coupling portion CA2a, the parasitic capacitance of the reset signal line SLrst and the reference signal line SLcom can be smaller than that in a configuration in which the base portions BA1 and BA2 are provided so as to overlap the reset signal line SLrst and the reference signal line SLcom.

The reference signal line SLcom is electrically coupled to the lower conductive layer 35 through a contact hole H11. The reference signal line SLcom is electrically coupled to the coupling portion CA2 through a contact hole H12. This configuration electrically couples the reference signal line SLcom to the p-type semiconductor layer 33 of each of the partial photodiodes 30S.

In the present embodiment, the partial photodiode 30S is provided for each of the first openings OP1 of the optical filter 7. This configuration can reduce portions of the semiconductor layers and wiring layers in an area not overlapping the first openings OP1 as compared with a configuration in which the photodiode 30 is formed of a solid film having, for example, a quadrilateral shape so as to cover the entire detection element 3 in the plan view. Therefore, the parasitic capacitance of the photodiode 30 can be reduced. Since the partial photodiodes 30S are provided, the degree of freedom of the layout of the transistors and the wiring can be increased, and thus, the transistors and the wiring can be provided so as not to overlap the photodiode 30. Thus, in the present embodiment, the parasitic capacitance of the photodiode 30 can be smaller than that in a case of providing the photodiode 30 so as to overlap the transistors and the wiring.

The planar structure of the photodiode 30 and the transistors illustrated in FIG. 6 is merely an example, and can be changed as appropriate. For example, the number of the partial photodiodes 30S included in each of the photodiodes 30 may be seven or smaller, or nine or larger. The arrangement of the partial photodiodes 30S is not limited to the triangular lattice pattern. The partial photodiodes 30S may be arranged, for example, in a matrix having a row-column configuration.

Figure 7:
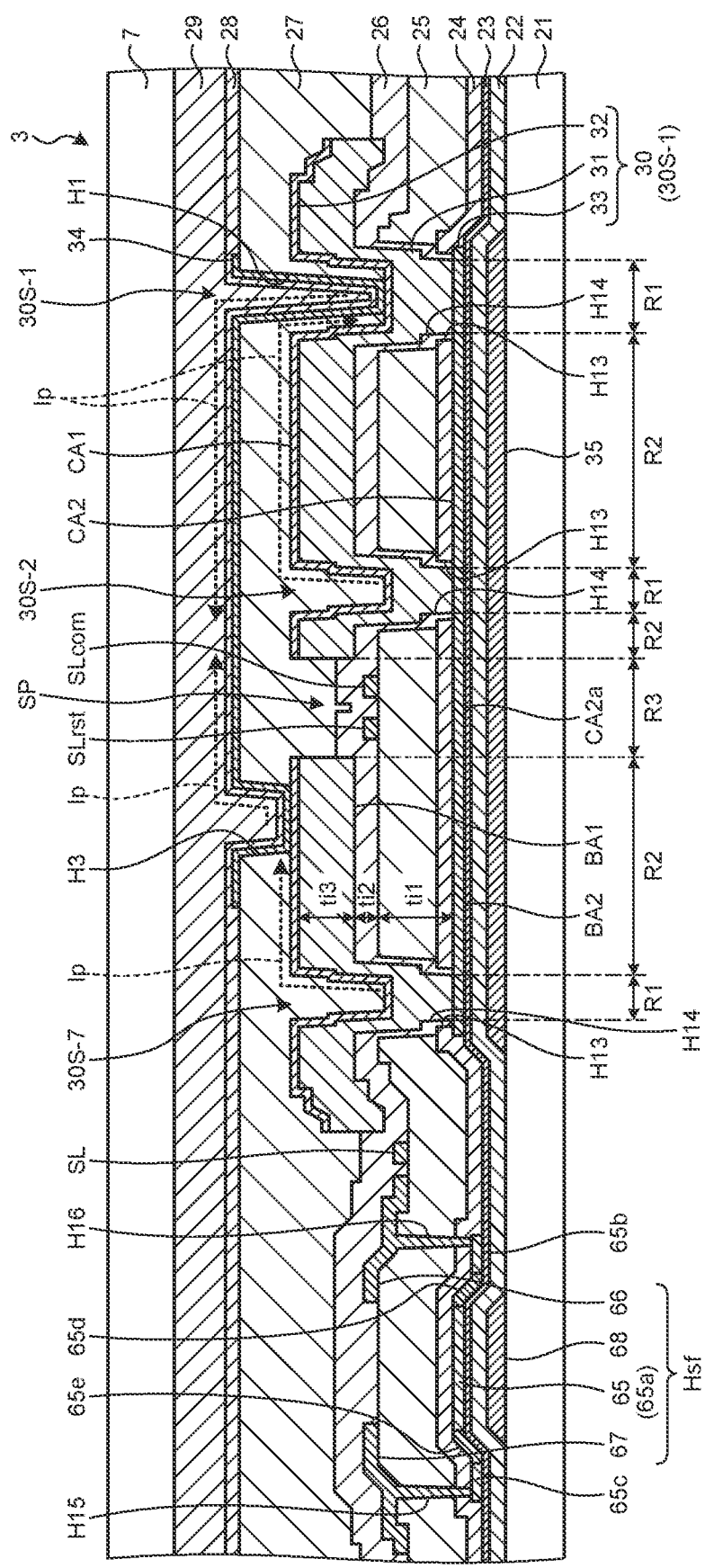
FIG. 7 is a VII-VII' sectional view of FIG. 6.
Figure 8:
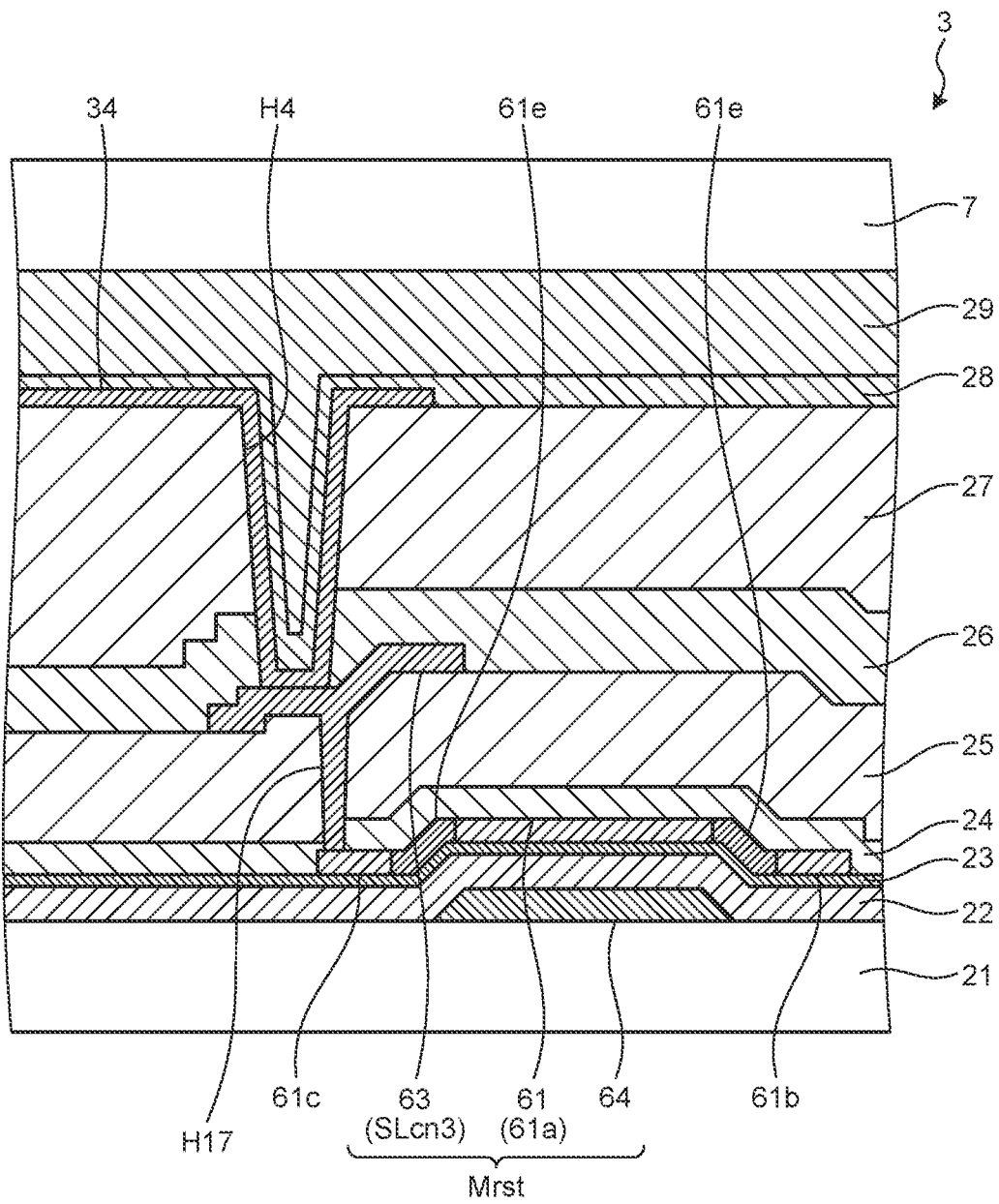
FIG. 8 is an VIII-VIII' sectional view of FIG. 6.

FIG. 7 is a VII-VII' sectional view of FIG. 6. FIG. 8 is an VIII-VIII' sectional view of FIG. 6. FIG. 7 illustrates the sectional configuration of the partial photodiodes 30S-1, 30S-2, and 30S-7, and also the sectional configuration of the source follower transistor Msf included in the detection element 3. FIG. 8 illustrates the sectional configuration of the reset transistor Mrst. The read transistor Mrd (not illustrated in FIGS. 7 and 8) has the same sectional configuration as that of the source follower transistor Msf and the reset transistor Mrst.

As illustrated in FIG. 7, the substrate 21 is an insulating substrate, and is formed using, for example, a glass substrate of, for example, quartz or alkali-free glass, or a resin substrate of, for example, polyimide. The gate electrode 68 is provided on the substrate 21. Insulating films 22 and 23 are provided on the substrate 21 so as to cover the gate electrode 68. The insulating films 22 and 23 and insulating films 24, 25, and 26 are inorganic insulating films and are formed of, for example, a silicon oxide ($SiO_2$) or a silicon nitride (SiN).

The semiconductor layer 65 is provided on the insulating film 23. For example, polysilicon is used as the semiconductor layer 65. The semiconductor layer 65 is, however, not limited thereto and may be formed of, for example, a microcrystalline oxide semiconductor, an amorphous oxide semiconductor, or low-temperature polycrystalline silicon (LTPS). The source follower transistor Msf has a bottom-gate structure in which the gate electrode 68 is provided on the lower side of the semiconductor layer 65. However, the source follower transistor Msf may have a top-gate structure in which the gate electrode 68 is provided on the upper side of the semiconductor layer 65, or a dual-gate structure in which the gate electrodes 68 are provided on the upper side and lower side of the semiconductor layer 65.

The semiconductor layer 65 has a channel region 65a, high-concentration impurity regions 65b and 65c, and low-concentration impurity regions 65d and 65e. The channel region 65a is, for example, a non-doped intrinsic semiconductor region or a low-impurity region, and has lower conductivity than that of the high-concentration impurity regions 65b and 65c and the low-concentration impurity regions 65d and 65e. The channel region 65a is provided in an area overlapping the gate electrode 68.

The insulating films 24 and 25 are provided on the insulating film 23 so as to cover the semiconductor layer 65. The source electrode 66 and the drain electrode 67 are provided on the insulating film 25. The source electrode 66 is coupled to the high-concentration impurity region 65b of the semiconductor layer 65 through the contact hole H16. The drain electrode 67 is coupled to the high-concentration impurity region 65c of the semiconductor layer 65 through the contact hole H15. The source and the drain electrodes 66 and 67 are formed of, for example, a multilayered film of Ti—Al—Ti layers or Ti—Al layers that has a multilayered structure of titanium and aluminum.

As illustrated in FIG. 8, the reset transistor Mrst has the same sectional configuration as that of the source follower transistor Msf illustrated in FIG. 7. That is, the drain electrode 63 (coupling wiring line SLcn3) is coupled to a high-concentration impurity region 61c of the semiconductor layer 61 through the contact hole H17. The insulating film 26 is provided on the insulating film 25 so as to cover the transistors including the reset transistor Mrst. The insulating film 27 is provided on the insulating film 26. The upper conductive layer 34 is provided on the insulating film 27. The upper conductive layer 34 is electrically coupled to the drain electrode 63 through the contact hole H4 provided through the insulating films 26 and 27.

Referring back to FIG. 7, the following describes the sectional configuration of the photodiode 30. While the partial photodiodes 30S-1, 30S-2, and 30S-7 are described with reference to FIG. 7, the description of the partial photodiodes 30S-1, 30S-2, and 30S-7 can also be applied to the other partial photodiodes 30S. As illustrated in FIG. 7, the lower conductive layer 35 is provided in the same layer as that of the gate electrode 68 on the substrate 21. The insulating films 22 and 23 are provided on the lower conductive layer 35. The photodiode 30 is provided on the insulating film 23. In other words, the lower conductive layer 35 is provided between the substrate 21 and the p-type semiconductor layer 33. The lower conductive layer 35 is formed of the same material as that of the gate electrode 68, and thereby serves as a light-blocking layer. Thus, the lower conductive layer 35 can restrain light from entering the photodiode 30 from the substrate 21 side.

The i-type semiconductor layer 31 is provided between the p-type semiconductor layer 33 and the n-type semiconductor layer 32 in the third direction Dz. In the present embodiment, the p-type semiconductor layer 33, the i-type semiconductor layer 31, and the n-type semiconductor layer 32 are stacked on the insulating film 23 in the order as listed.

Specifically, the p-type semiconductor layer 33 is provided in the same layer as the semiconductor layers 61 and 65 on the insulating film 23. The insulating films 24, 25, and 26 are provided so as to cover the p-type semiconductor layer 33. The insulating films 24 and 25 are provided with a contact hole H13 in a position overlapping the p-type semiconductor layer 33. The insulating film 26 is provided on the insulating film 25 and covers side surfaces of the insulating films 24 and 25 constituting an inner wall of the contact hole H13. The insulating film 26 is provided with a contact hole H14 in a position overlapping the p-type semiconductor layer 33.

The i-type semiconductor layer 31 is provided on the insulating film 26, and is coupled to the p-type semiconductor layer 33 through the contact hole H14 penetrating from the insulating film 24 to the insulating film 26. The n-type semiconductor layer 32 is provided on the i-type semiconductor layer 31.

In more detail, the photodiode 30 has the first regions R1, second regions R2 and a third region R3. The first regions R1 are provided corresponding to the partial photodiodes 30S. In each of the first regions R1, the p-type semiconductor layer 33, the i-type semiconductor layer 31, and the n-type semiconductor layer 32 are stacked so as to be directly in contact with one another. In other words, the first region R1 is a region defined by a bottom surface of the contact hole H14.

The second regions R2 are provided between the first regions R1. In each of the second regions R2, at least the p-type semiconductor layer 33 and the i-type semiconductor layer 31 are stacked so as to be separate from each other in a direction orthogonal to the substrate 21 (in the third direction Dz). More specifically, the second region R2 includes the insulating films 24, 25, and 26 provided between the p-type semiconductor layer 33 and the i-type semiconductor layer 31. The second region R2 is, however, not limited thereto and may include one or two layers of insulating films, or four or more layers of insulating films between the p-type semiconductor layer 33 and the i-type semiconductor layer 31.

In the second region R2, the thickness of the insulating films 24, 25, and 26 (the total thickness of a thickness ti1 of the insulating films 24 and 25 and a thickness ti2 of the insulating film 26) provided between the p-type semiconductor layer 33 and the i-type semiconductor layer 31 is larger than a thickness ti3 of the i-type semiconductor layer 31. The thickness ti1 of the insulating films 24 and 25 is larger than the thickness ti2 of the insulating film 26. The distance between the p-type semiconductor layer 33 and the n-type semiconductor layer 32 of the second region R2 is longer than the distance between the p-type semiconductor layer 33 and the n-type semiconductor layer 32 of the first region R1. The thickness relation between the i-type semiconductor layer 31 and the insulating films 24, 25, and 26 is not limited to the above-described relation, and a configuration can be employed in which the total thickness of the three layers of the insulating films 24, 25, and 26 is smaller than the thickness of the i-type semiconductor layer 31. In the second region R2, the insulating films 24, 25, and 26 having a predetermined thickness need to be present between the i-type semiconductor layer 31 (and/or the n-type semiconductor layer 32) and the p-type semiconductor layer 33. Various thicknesses can be employed as the thickness of the insulating films 24, 25, and 26.

The second regions R2 are provided around the first regions R1 in the plan view and include the coupling portions CA1 and CA2 and the base portions BA1 and BA2. The partial photodiodes 30S-1, 30S-2, and 30S-3 (FIG. 7 does not illustrate the partial photodiode 30S-3) are coupled together by the coupling portion CA1 including the i-type semiconductor layer 31 and the n-type semiconductor layer 32 stacked on the insulating film 26 and the coupling portion CA2 including the p-type semiconductor layer 33 formed on the insulating film 23. In the same manner, the partial photodiodes 30S-4 to 30S-8 (refer to FIG. 6) are coupled together by the base portion BA1 including the i-type semiconductor layer 31 and the n-type semiconductor layer 32 stacked on the insulating film 26 and the base portion BA2 including the p-type semiconductor layer 33 formed on the insulating film 23.

With the above-described configuration, the capacitance per unit area generated between the i-type semiconductor layer 31 and the p-type semiconductor layer 33 in the second regions R2 is smaller than the capacitance per unit area generated between the i-type semiconductor layer 31 and the p-type semiconductor layer 33 in the first regions R1. Therefore, the capacitance Cs of each of the photodiodes 30 (refer to FIG. 4) can be reduced as compared with the configuration in which the photodiode 30 is formed of a solid film having, for example, a quadrilateral shape so as to cover the entire detection element 3 in the plan view, that is, a configuration in which the i-type semiconductor layer 31 and the n-type semiconductor layer 32 of the second regions R2 are provided in the same layer as the first regions R1. As a result, even under detection conditions where the same light is emitted and the exposure is performed for the same exposure time T, the signal $\Delta V n1$ can be increased as represented by Expression (2) given above, and thus, the detection sensitivity of the detection device 1 can be increased. The capacitance generated between the i-type semiconductor layer 31 and the p-type semiconductor layer 33 has been described above. However, in view of the fact that the i-type semiconductor layer 31 directly contacts the n-type semiconductor layer 32, and the p-type semiconductor layer faces the n-type semiconductor layer with the i-type semiconductor layer 31 interposed therebetween, the above-description of the capacitance can naturally be replaced with a description of capacitance between the p-type semiconductor layer 33 and the n-type semiconductor layer 32.

The p-type semiconductor layer 33 is provided in the third region R3, and the i-type semiconductor layer 31 and the n-type semiconductor layer 32 are provided so as not to overlap the p-type semiconductor layer 33. The third region R3 is a region provided with the above-described coupling portion CA2a including the p-type semiconductor layer 33. That is, in the third region R3, the adjacent first regions R1 are coupled to each other at least by the p-type semiconductor layer 33. In the third region R3, the insulating films 24 and 25 are provided on the p-type semiconductor layer 33, and the reset signal line SLrst and the reference signal line SLcom are provided above the insulating films 24 and 25 provided on the p-type semiconductor layer 33. In other words, a gap SP of the i-type semiconductor layer 31 and the n-type semiconductor layer 32 is provided on the reset signal line SLrst and the reference signal line SLcom. Such a configuration can ensure insulation between each of the signal lines and the n-type semiconductor layer 32 as compared with a configuration in which the i-type semiconductor layer 31 and the n-type semiconductor layer 32 are provided so as to overlap the reset signal line SLrst and the reference signal line SLcom.

The insulating film 27 is provided on the insulating film 26 so as to cover the photodiode 30. The insulating film 27 is provided so as to be directly in contact with the photodiode 30 and the insulating film 26. The insulating film 27 is formed of an organic material such as a photosensitive acrylic resin. The insulating film 27 is thicker than the insulating film 26. The thickness relation between these insulating films may be reversed. The insulating film 27 has a better step coverage property than that of inorganic insulating materials and is provided so as to cover side surfaces of the i-type semiconductor layer 31 and the n-type semiconductor layer 32.

The upper conductive layer 34 is provided above the insulating film 27. The upper conductive layer 34 is formed of, for example, a light-transmitting conductive material such as indium tin oxide (ITO). The upper conductive layer 34 is provided along a surface of the insulating film 27 and is coupled to the n-type semiconductor layer 32 through the contact holes H1 and H3 provided in the insulating film 27. With this configuration, signals (photocurrents Ip) output from the respective partial photodiodes 30S are integrated in the common upper conductive layer 34 and are output as one detection signal Vdet through the source follower transistor Msf and the read transistor Mrd (refer to FIG. 4).

The contact hole H1 is provided in a position overlapping the first region R1, and the n-type semiconductor layer 32 of the partial photodiode 30S-1 is coupled to the upper conductive layer 34 on the bottom surface of the contact hole H1. Neither of the contact holes H1 and H3 is formed in the first regions R1 of the partial photodiodes 30S-2 and 30S-7. The contact hole H3 is provided in a position overlapping the second region R2. The width of the first region R1 of the partial photodiode 30S-1 is larger than the width of the first region R1 of each of the partial photodiodes 30S-2 and 30S-7. However, the upper conductive layer 34 only needs to be coupled to the n-type semiconductor layer 32 at any location, and the first regions R1 of the partial photodiodes 30S may be formed to have the same width and the same shape.

An insulating film 28 is provided on the insulating film 27 so as to cover the upper conductive layer 34. The insulating film 28 is an inorganic insulating film. The insulating film 28 is provided as a protective layer for restraining water from entering the photodiode 30.

A protective film 29 is provided on the insulating film 28. The protective film 29 is an organic protective film. The protective film 29 is formed so as to planarize a surface of the detection device 1.

In the present embodiment, the p-type semiconductor layer 33 and the lower conductive layer 35 of the photodiode 30 are provided in the same layers as those of the transistors. Therefore, the manufacturing process can be simpler than in a case where the photodiode 30 is formed in layers different from those of the transistors.

The sectional configuration of the photodiode 30 illustrated in FIG. 7 is merely an example. The sectional configuration is not limited to this example. For example, the photodiode 30 may be provided in layers different from those of the transistors. The stacking order of the p-type semiconductor layer 33, the i-type semiconductor layer 31, and the n-type semiconductor layer 32 is also not limited to that of FIG. 7. The stacking may be made in the order of the n-type semiconductor layer 32, the i-type semiconductor layer 31, and the p-type semiconductor layer 33.

The following describes a configuration example of the optical filter 7. FIG. 9 is a sectional view illustrating the configuration example of the optical filter. FIG. 9 illustrates a simplified configuration of the array substrate 2 and schematically illustrates the photodiode 30 (partial photodiode 30S-1) and the protective film 29 covering the photodiode 30.

The optical filter 7 is an optical element that transmits, toward the photodiode 30, a component of the light L2 that has been reflected by the object to be detected such as the finger Fg and travels in a third direction Dz, and blocks components of the light L2 that travel in oblique directions. The optical filter 7 is also called collimating apertures or a collimator.

As illustrated in FIG. 9, the optical filter 7 includes the first light-blocking layer 71, the second light-blocking layer 72, a first light-transmitting resin layer 74, a second light-transmitting resin layer 75, and the lens 78. In the present embodiment, the first light-blocking layer 71, the first light-transmitting resin layer 74, the second light-blocking layer 72, the second light-transmitting resin layer 75, and the lens 78 are stacked on the protective film 29 in the order as listed.

The lenses 78 are provided in areas overlapping the partial photodiodes 30S of the photodiode 30. Each of the lenses 78 is a convex lens. An optical axis CL of the lens 78 is provided in a direction parallel to the third direction Dz and intersects the partial photodiode 30S. The lens 78 is provided on the second light-transmitting resin layer 75 so as to be directly in contact therewith. In the present embodiment, no light-blocking layer or the like is provided on the second light-transmitting resin layer 75 between the adjacent lenses 78.

The first light-blocking layer 71 and the second light-blocking layer 72 are provided between the photodiode 30 and the lens 78 in the third direction Dz. The first light-blocking layer 71 is provided with the first opening OP1 in an area overlapping the photodiode 30. The second light-blocking layer 72 is provided with the second opening OP2 in an area overlapping the photodiode 30. The first and the second openings OP1 and OP2 are formed in an area overlapping the optical axis CL.

The first light-blocking layer 71 is formed of, for example, a metal material such as molybdenum (Mo). As a result, the first light-blocking layer 71 can reflect the components of the light L2 traveling in the oblique directions other than the light L2 passing through the first opening OP1.

The second light-blocking layer 72 is formed of, for example, a resin material colored in black. As a result, the second light-blocking layer 72 serves as a light-absorbing layer that absorbs the components of the light L2 traveling in the oblique directions other than the light L2 passing through the second opening OP2. For example, the second light-blocking layer 72 can absorb light reflected by the first light-blocking layer 71 and extraneous light incident between the adjacent lenses 78.

In the present embodiment, the width decreases in the order of a width W3 of the lens 78 in the first direction Dx, a width W2 of the second opening OP2 in the first direction Dx, and a width W1 of the first opening OP1 in the first direction Dx. The width W1 of the first opening OP1 in the first direction Dx is smaller than the width of the partial photodiode 30S of the photodiode 30 in the first direction Dx.

A thickness TH2 of the second light-transmitting resin layer 75 illustrated in FIG. 9 is set to be larger than a thickness TH1 of the first light-transmitting resin layer 74. The thickness TH1 of the first light-transmitting resin layer 74 and the thickness TH2 of the second light-transmitting resin layer 75 are larger than a thickness TH3 of the protective film 29 of the array substrate 2.

With the above-described configuration, light L2-1 traveling in the third direction Dz among rays of the light L2 reflected by the object to be detected such as the finger Fg is condensed by the lens 78, and passes through the second opening OP2 and the first opening OP1 to enter the photodiode 30. Light L2-2 that tilts by an angle θ1 from the third direction Dz also passes through the second opening OP2 and the first opening OP1 to enter the photodiode 30.

The optical filter 7 is integrally formed with the array substrate 2. That is, the first light-blocking layer 71 of the optical filter 7 is provided above the protective film 29 so as to be directly in contact therewith, and any member such as an adhesive layer is not provided between the first light-blocking layer 71 and the protective film 29. The optical filter 7 is directly formed as a film on the array substrate 2 and is formed by being subjected to a process such as patterning. Therefore, the positional accuracy of the first opening OP1, the second opening OP2, and the lens 78 of the optical filter 7 with respect to the photodiode 30 can be improved as compared with a case of attaching the optical filter 7 as a separate component to the array substrate 2.

The configuration of the optical filter 7 illustrated in FIG. 9 is merely an example and can be changed as appropriate. For example, the optical filter 7 may be formed separately from the array substrate 2. The relations between the widths W1, W2, and W3 and between the thicknesses TH1, TH2, and TH3 may also be changed as appropriate in accordance with required optical characteristics. The optical filter 7 is not limited to the configuration provided with the first and the second light-blocking layers 71 and 72 and may be provided with only one first light-blocking layer 71.

Modifications

Figure 10:
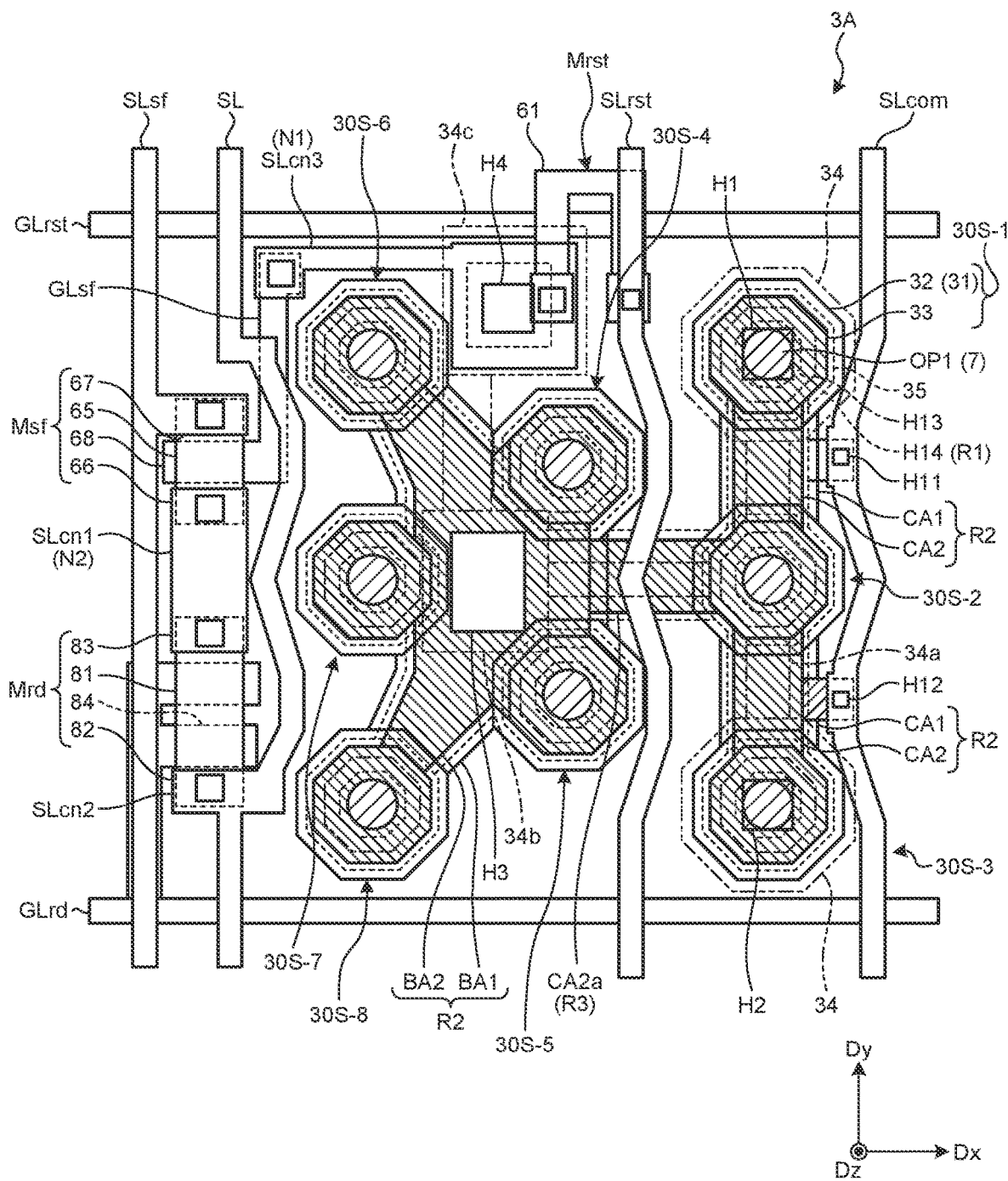
FIG. 10 is a plan view illustrating a detection element according to a fourth modification.

FIG. 10 is a plan view illustrating a detection element according to a fourth modification. In the following description, the same components as those described in the embodiment described above are denoted by the same reference numerals, and the description thereof will not be repeated.

As illustrated in FIG. 10, the configuration of a detection element 3A according to the fourth modification differs from that of the embodiment described above in that the shape in the plan view of the partial photodiode 30S is polygonal. The partial photodiode 30S has an octagonal shape, for example. That is, the i-type semiconductor layer 31, the n-type semiconductor layer 32, and the p-type semiconductor layer 33 forming the partial photodiode 30S are octagonal. The lower conductive layer 35 and the upper conductive layer 34 are also octagonal.

The detection element 3A illustrated in FIG. 10 is merely an example, and the shape of the partial photodiode 30S may be changed as appropriate. For example, the partial photodiode 30S may have a polygonal shape other than the octagonal shape, and the partial photodiodes 30S may have different shapes from one another.

The reference signal line SLcom is adjacent to the reset signal line SLrst in the first direction Dx with the partial photodiodes 30S-1, 30S-2, and 30S-3 interposed therebetween. In the present modification, one reset signal line SLrst is provided so as to intersect the coupling portion CA2a.

The arrangement of the signal lines is merely an example and can be changed as appropriate. The arrangement of the transistors can also be changed as appropriate depending on the number and arrangement of the partial photodiodes 30S.

Figure 11:
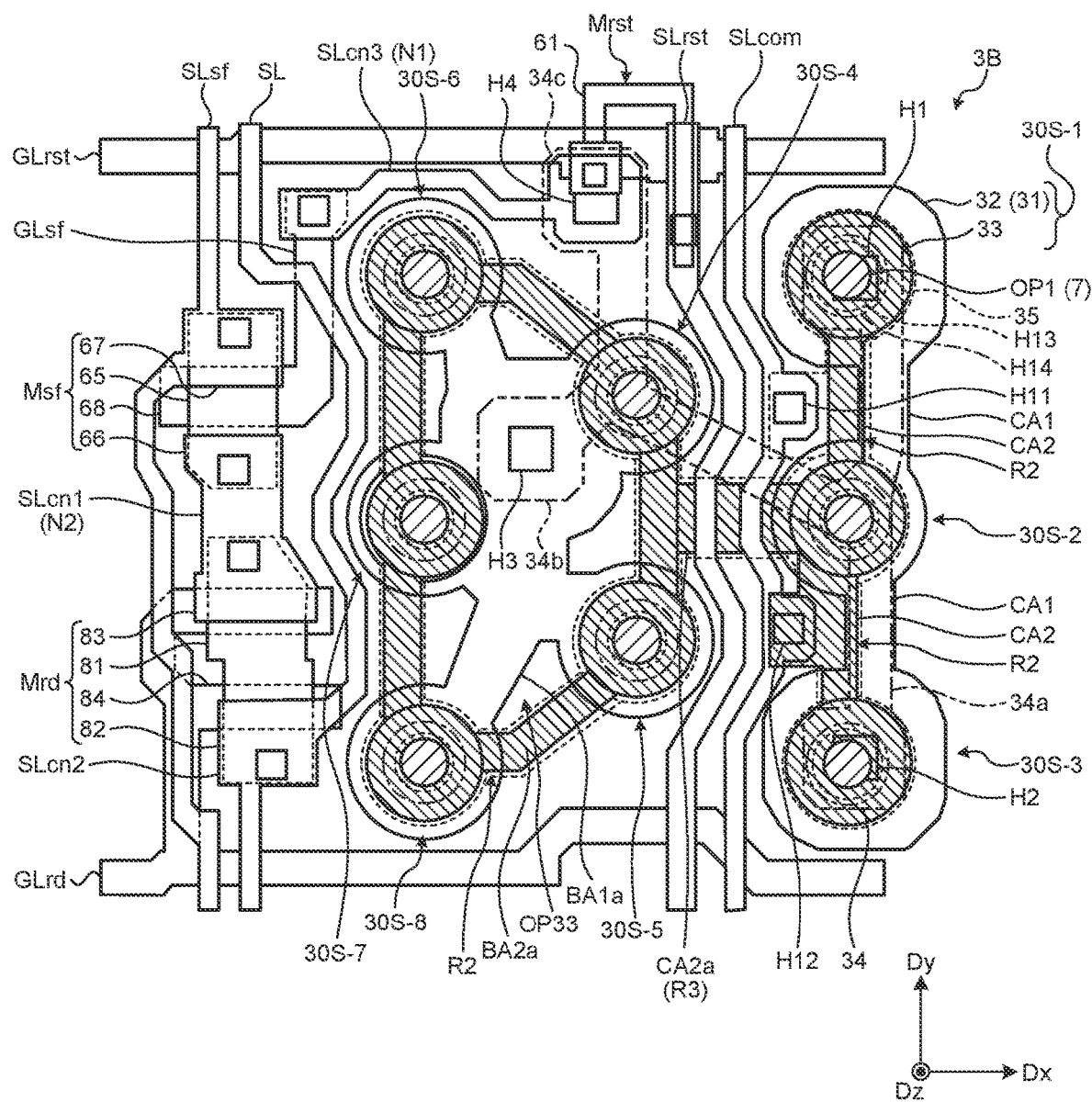
FIG. 11 is a plan view illustrating a detection element according to a fifth modification.

FIG. 11 is a plan view illustrating a detection element according to a fifth modification. As illustrated in FIG. 11, the configuration of a detection element 3B according to the fifth modification differs from those of the embodiment and the fourth modification described above in that base portions BA1a and BA2a are arranged so as to have a smaller overlapping area with each other. In addition, the coupling portions CA1 and CA2 are arranged so as to have a smaller overlapping area with each other. That is, in the plan view, the n-type semiconductor layers 32 (the base portion BA1a and the coupling portion CA1) that couples together the adjacent first regions R1 are arranged so as not to overlap a part of the p-type semiconductor layers 33 (the base portion BA2a and the coupling portion CA2) that couples together the adjacent first regions R1.

Specifically, an opening OP33 is provided in a central portion of the base portion BA2a including the p-type semiconductor layer 33. In other words, the base portion BA2a is annularly provided by coupling together the adjacent p-type semiconductor layers 33 of the partial photodiodes 30S-4, 30S-5, 30S-6, 30S-7, and 30S-8 arranged in a substantially pentagonal shape. The base portion BA1a including the i-type semiconductor layers 31 and the n-type semiconductor layers 32 is provided in an area overlapping the opening OP33. In other words, the base portion BA1a is located in an area surrounded by the annularly disposed base portion BA2a. With this configuration, most of the base portion BA1a is disposed so as not to overlap the base portion BA2a. Compared with the embodiment and the fourth modification described above, the overlapping area of the base portions BA1a and BA2a is smaller, and the parasitic capacitance between the p-type semiconductor layers 33 and the n-type semiconductor layers 32 facing each other with the insulating films 23, 24, and 25 (refer to FIG. 7) interposed therebetween can be reduced.

In the partial photodiodes 30S-1, 30S-2, and 30S-3 arranged in the second direction Dy, the coupling portion CA1 including the i-type semiconductor layers 31 and the n-type semiconductor layers 32 is arranged so as to be shifted in the first direction Dx (rightward in FIG. 11) from the coupling portion CA2 including the p-type semiconductor layers 33. The right side in the first direction Dx of the coupling portion CA2 and the left side in the first direction Dx of the coupling portion CA1 are arranged so as to slightly overlap each other. With this configuration, most of the coupling portion CA1 is disposed so as not to overlap the coupling portion CA2. Therefore, the overlapping area of the coupling portions CA1 and CA2 is made smaller, and the parasitic capacitance between the p-type semiconductor layers 33 and the n-type semiconductor layers 32 facing each other with the insulating films 23, 24, and 25 (refer to FIG. 7) interposed therebetween can be reduced.

In the partial photodiodes 30S-1 and 30S-3, the area of each of the i-type semiconductor layer 31 and the n-type semiconductor layer 32 is formed to be larger than that of the p-type semiconductor layer 33, and the centroid position of the i-type semiconductor layer 31 and the n-type semiconductor layer 32 is shifted from that of the p-type semiconductor layer 33. This configuration allows the partial photodiodes 30S-1 and 30S-3 to be provided with the contact holes H1 and H2 for being coupled to the upper conductive layer 34, and the coupling portion CA1 to be arranged so as to be shifted in the first direction Dx.

In addition, the area of the upper conductive layer 34 is also formed to be smaller than those in the embodiment and the fourth modification described above. Specifically, the area of the coupling portion 34b of the upper conductive layer 34 is made smaller, and the position of the coupling portion 34b is also shifted in the second direction Dy (upward in FIG. 11) from the centroid position of the pentagonally arranged partial photodiodes 30S-4, 30S-5, 30S-6, 30S-7, and 30S-8. This configuration reduces the coupling distance between the coupling portion 34b and the coupling portion 34c of the upper conductive layer 34 and the coupling distance between the coupling portion 34b and the coupling portion 34a of the partial photodiodes 30S-1, 30S-2, and 30S-3. This configuration reduces the area of the upper conductive layer 34 and reduces the parasitic capacitance between the upper conductive layer 34 and the first light-blocking layer 71 of the optical filter 7 (refer to FIG. 9) facing each other with the insulating film 28 and the protective film 29 (refer to FIG. 7) interposed therebetween.

The configuration illustrated in FIG. 11 is merely an example, and can be changed as appropriate. For example, the base portion BA2a coupling together the partial photodiodes 30S-4, 30S-5, 30S-6, 30S-7, and 30S-8 is not limited to the configuration formed by being annularly coupled to one another. The base portion BA2a coupling the partial photodiode 30S-4 to the partial photodiode 30S-7, or the base portion BA2a coupling the partial photodiode 30S-5 to the partial photodiode 30S-7 may be provided, or the base portion BA2a may be partially provided with slits and separated into portions.

While the preferred embodiment of the present disclosure has been described above, the present disclosure is not limited to the embodiment described above. The content disclosed in the embodiment is merely an example, and can be variously modified within the scope not departing from the gist of the present disclosure. Any modifications appropriately made within the scope not departing from the gist of the present disclosure also naturally belong to the technical scope of the present disclosure. At least one of various omissions, substitutions, and changes of the components can be made without departing from the gist of the embodiment and the modifications described above.

What is claimed is:

1. A detection device comprising:
a substrate; and
a plurality of photodiodes arranged on the substrate,
wherein each of the photodiodes comprises a p-type semiconductor layer, an i-type semiconductor layer, and an n-type semiconductor layer stacked on the substrate,
wherein each of the photodiodes comprises
a plurality of first regions in each of which the p-type semiconductor layer, the i-type semiconductor layer, and the n-type semiconductor layer are stacked so as to be directly in contact with one another, and
a second region in which at least the p-type semiconductor layer and the i-type semiconductor layer are stacked so as to be separate from each other, and
wherein adjacent first regions included in the plurality of first regions are coupled together by at least the p-type semiconductor layer.

2. The detection device according to claim 1, wherein a distance between the p-type semiconductor layer and the n-type semiconductor layer in the second region is longer than a distance between the p-type semiconductor layer and the n-type semiconductor layer in each first region.

3. The detection device according to claim 1, wherein the second region comprises an insulating film provided between the p-type semiconductor layer and the i-type semiconductor layer.

4. The detection device according to claim 1, wherein the second region comprises a plurality of insulating films provided between the p-type semiconductor layer and the i-type semiconductor layer.

5. The detection device according to claim 3, wherein a thickness of the insulating film provided between the p-type semiconductor layer and the i-type semiconductor layer is larger than a thickness of the i-type semiconductor layer.

6. The detection device according to claim 4, wherein a thickness of each of the insulating films provided between the p-type semiconductor layer and the i-type semiconductor layer is larger than a thickness of the i-type semiconductor layer.

7. The detection device according to claim 1, further comprising transistors provided corresponding to the photodiodes,
wherein the p-type semiconductor layer is provided in the same layer as a semiconductor layer of each of the transistors.

8. The detection device according to claim 1,
wherein the photodiode comprises a third region in which the p-type semiconductor layer is provided, and the i-type semiconductor layer and the n-type semiconductor layer do not overlap the p-type semiconductor layer, and
wherein the third region comprises
an insulating film provided on the p-type semiconductor layer and
a signal line provided on the insulating film provided on the p-type semiconductor layer.

9. The detection device according to claim 1, wherein the first regions are arranged in a triangular lattice pattern in a plan view from a direction orthogonal to the substrate.

10. The detection device according to claim 1, wherein the n-type semiconductor layer that couples together adjacent first regions is arranged so as not to overlap a part of the p-type semiconductor layer that couples together the adjacent first regions in a plan view from a direction orthogonal to the substrate.

11. A display device comprising:
the detection device according to claim 1; and
a light-transmitting display,
wherein the detection device is provided on a back side of the display.

12. The display device according to claim 11, wherein the display is a selfluminous display.

13. An illumination device with a detection function comprising:
the detection device according to claim 1; and
a light-transmitting illumination device,
wherein the detection device is provided on a back side of the illumination device.

14. An illumination device with a detection function comprising:
the detection device according to claim 1; and
a light-transmitting illumination device,
wherein the detection device includes a light-transmitting region in an area other than an area provided with the photodiodes and is provided on a back side of the illumination device.

* * * * *